(12) United States Patent
Chen et al.

(10) Patent No.: US 7,545,059 B2
(45) Date of Patent: Jun. 9, 2009

(54) CHIP-SCALE COILS AND ISOLATORS BASED THEREON

(75) Inventors: Baoxing Chen, Westford, MA (US); Ronn Kliger, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/704,459

(22) Filed: Feb. 9, 2007

(65) Prior Publication Data

US 2008/0030080 A1 Feb. 7, 2008

Related U.S. Application Data

(63) Continuation of application No. 10/214,883, filed on Aug. 8, 2002, now abandoned, which is a continuation-in-part of application No. 09/838,520, filed on Apr. 19, 2001, now Pat. No. 6,873,065, which is a continuation-in-part of application No. 09/557,542, filed on Apr. 25, 2000, now Pat. No. 6,291,907, which is a continuation of application No. 09/118,032, filed on Jul. 17, 1998, now Pat. No. 6,054,780.

(60) Provisional application No. 60/063,221, filed on Oct. 23, 1997.

(51) Int. Cl.
*H01F 27/42* (2006.01)
(52) U.S. Cl. ..................................... 307/412
(58) Field of Classification Search .................. 307/412
See application file for complete search history.

(56) References Cited

U.S. PATENT DOCUMENTS

| 3,058,078 A | 10/1962 | Hoh |
| 3,537,022 A | 10/1970 | Regan ........................ 330/10 |
| 3,714,540 A | 1/1973 | Galloway ..................... 321/2 |
| 3,760,198 A | 9/1973 | Mori et al. |
| 3,798,608 A | 3/1974 | Huebner .................. 340/172.5 |

(Continued)

FOREIGN PATENT DOCUMENTS

DE 19718420 A1 11/1998

(Continued)

OTHER PUBLICATIONS

Burr-Brown, "Dual, Isolated, Bi-Directional Digital Coupler", 1993, ISO150.

(Continued)

*Primary Examiner*—Robert L. Deberadinis
(74) *Attorney, Agent, or Firm*—Kenyon & Kenyon LLP

(57) ABSTRACT

Coil structures and isolators using them. A coil(s) is (are) used as a magnetic field-generating element(s) paired with another coil(s) or other magnetic field-receiving element(s). The coil(s) is(are) formed in or on a substrate which does not include some or all of the driver (i.e., input) or receiver (i.e., output) circuits. The coil(s) and magnetic field-receiving element(s) thus can be manufactured separately from the driver and/or receiver circuitry, using different processes, instead of subjecting the chip areas containing both input and output circuits to post processing to form the coil(s). Isolators can be assembled using such coils with a resultant lower cost. Isolators also can be assembled using transformers made from such coils wherein the transformers can be driven on either of their windings in order to provide bi-directional isolation with a single transformer.

44 Claims, 12 Drawing Sheets

U.S. PATENT DOCUMENTS

| | | | |
|---|---|---|---|
| 3,808,673 A | 5/1974 | Bottini | |
| 4,024,452 A | 5/1977 | Seidel | |
| 4,027,152 A | 5/1977 | Brown et al. | 250/199 |
| 4,118,603 A | 10/1978 | Kumhyr | 179/16 E |
| 4,227,045 A | 10/1980 | Chelcun et al. | 178/66.1 |
| 4,275,404 A | 6/1981 | Cassiday et al. | |
| 4,302,807 A | 11/1981 | Mentler | 363/134 |
| 4,538,136 A | 8/1985 | Drabing | |
| 4,547,961 A | 10/1985 | Bokil et al. | |
| 4,703,283 A | 10/1987 | Samuels | |
| 4,748,419 A | 5/1988 | Somerville | 330/10 |
| 4,780,795 A | 10/1988 | Meinel | |
| 4,785,345 A * | 11/1988 | Rawls et al. | 257/531 |
| 4,817,865 A | 4/1989 | Wray | 236/49.5 |
| 4,818,855 A | 4/1989 | Mongeon et al. | 235/440 |
| 4,825,450 A | 4/1989 | Herzog | 375/17 |
| 4,835,486 A | 5/1989 | Somerville | 330/10 |
| 4,859,877 A | 8/1989 | Cooperman et al. | 307/443 |
| 4,885,582 A | 12/1989 | LaBarge et al. | 341/57 |
| 4,922,883 A | 5/1990 | Iwasaki | 123/598 |
| 4,924,210 A | 5/1990 | Matsui et al. | |
| 4,937,468 A | 6/1990 | Shekhawat et al. | |
| 4,945,264 A | 7/1990 | Lee et al. | 307/475 |
| 4,959,631 A | 9/1990 | Hasegawa et al. | |
| 5,041,780 A | 8/1991 | Rippel | 324/117 |
| 5,057,968 A | 10/1991 | Morrison | 361/385 |
| 5,095,357 A | 3/1992 | Andoh et al. | |
| 5,102,040 A | 4/1992 | Harvey | 236/49.3 |
| 5,128,729 A | 7/1992 | Alonas et al. | |
| 5,142,432 A | 8/1992 | Schneider | 361/91 |
| 5,164,621 A | 11/1992 | Miyamoto et al. | |
| 5,204,551 A | 4/1993 | Bjornholt | 307/265 |
| 5,270,882 A | 12/1993 | Jove et al. | 360/67 |
| 5,293,400 A | 3/1994 | Monrod et al. | |
| 5,334,882 A | 8/1994 | Ting | |
| 5,353,001 A | 10/1994 | Meinel et al. | |
| 5,369,666 A | 11/1994 | Folwell et al. | |
| 5,384,808 A | 1/1995 | Van Brunt et al. | |
| 5,396,394 A | 3/1995 | Gee | 361/58 |
| 5,467,607 A | 11/1995 | Harvey | 62/186 |
| 5,469,098 A | 11/1995 | Johnson, Jr. | |
| 5,484,012 A | 1/1996 | Hiratsuka | 165/40 |
| 5,533,054 A | 7/1996 | DeAndrea et al. | 375/286 |
| 5,539,241 A | 7/1996 | Abidi et al. | |
| 5,539,598 A | 7/1996 | Denison et al. | 360/113 |
| 5,572,179 A | 11/1996 | Ito et al. | |
| 5,588,021 A | 12/1996 | Hunt et al. | 375/211 |
| 5,596,466 A | 1/1997 | Ochi | 361/18 |
| 5,650,357 A | 7/1997 | Dobkin et al. | |
| 5,701,037 A | 12/1997 | Weber et al. | 257/777 |
| 5,714,938 A | 2/1998 | Schwabl | 340/584 |
| 5,716,323 A | 2/1998 | Lee | |
| 5,731,954 A | 3/1998 | Cheon | 361/699 |
| 5,774,791 A | 6/1998 | Strohallen et al. | |
| 5,781,071 A | 7/1998 | Kusunoki | |
| 5,781,077 A | 7/1998 | Leitch et al. | |
| 5,786,979 A | 7/1998 | Douglass | 361/328 |
| 5,801,602 A | 9/1998 | Fawal et al. | |
| 5,812,598 A | 9/1998 | Sharma et al. | |
| 5,825,259 A | 10/1998 | Harpham et al. | |
| 5,831,426 A | 11/1998 | Black, Jr. et al. | 324/127 |
| 5,831,525 A | 11/1998 | Harvey | 340/507 |
| 5,877,667 A | 3/1999 | Wollesen | |
| 5,900,683 A | 5/1999 | Rinehart et al. | |
| 5,926,358 A | 7/1999 | Dobkin et al. | |
| 5,942,937 A | 8/1999 | Bell | |
| 5,952,849 A | 9/1999 | Haigh | 326/82 |
| 5,969,590 A | 10/1999 | Gutierrez | 336/200 |
| 6,054,780 A | 4/2000 | Haigh et al. | 307/91 |
| 6,069,802 A | 5/2000 | Priegnitz | |
| 6,087,882 A | 7/2000 | Chen et al. | 327/333 |
| 6,104,003 A | 8/2000 | Jones | 219/400 |
| 6,124,756 A | 9/2000 | Yaklin et al. | 326/30 |
| 6,262,600 B1 | 7/2001 | Haigh et al. | 326/82 |
| 6,291,907 B1 | 9/2001 | Haigh et al. | 307/91 |
| 6,432,818 B1 * | 8/2002 | Akram et al. | 438/653 |
| 6,501,363 B1 | 12/2002 | Hwu et al. | |
| 6,525,566 B2 | 2/2003 | Haigh | 326/82 |
| 6,720,816 B2 | 4/2004 | Strzalkowski | |
| 6,728,320 B1 | 4/2004 | Khasnis et al. | |
| 6,873,065 B2 | 3/2005 | Haigh et al. | |
| 6,903,578 B2 | 6/2005 | Haigh et al. | |
| 6,911,860 B1 | 6/2005 | Wang et al. | |
| 6,922,080 B2 | 7/2005 | Haigh et al. | |
| 6,927,662 B2 | 8/2005 | Kahlmann et al. | |
| 7,075,329 B2 | 7/2006 | Chen et al. | |
| 2003/0042571 A1 | 3/2003 | Szostkiewicz et al. | |
| 2003/0052712 A1 | 3/2003 | Comer | |
| 2005/0272378 A1 | 12/2005 | Dupuis | |

FOREIGN PATENT DOCUMENTS

| | | |
|---|---|---|
| DE | 19922129 C1 | 9/2000 |
| DE | 19922123 A1 | 11/2000 |
| DE | 19922127 A1 | 11/2000 |
| DE | 19922128 C1 | 1/2001 |
| DE | 19922127 C2 | 5/2002 |
| EP | 0282102 | 9/1988 |
| EP | 0307345 | 3/1989 |
| EP | 307345 A1 | 3/1989 |
| EP | 0586062 A1 | 7/1993 |
| EP | 0586062 A | 3/1994 |
| EP | 917309 A2 | 5/1999 |
| EP | 977 406 A1 | 2/2000 |
| EP | 0977406 | 2/2000 |
| FR | 2679670 | 7/1991 |
| GB | 2173956 A | 10/1986 |
| JP | 57132460 | 2/1981 |
| JP | 58215833 | 12/1983 |
| WO | WO 95/20768 | 1/1995 |
| WO | WO 98/37672 | 8/1998 |
| WO | WO98/48541 A | 10/1998 |
| WO | WO 99/21332 | 10/1998 |
| WO | WO 01/28094 | 4/2001 |
| WO | WO 01/61951 | 8/2001 |
| WO | WO 02/073914 | 9/2002 |
| WO | WO 02/086969 | 10/2002 |

OTHER PUBLICATIONS

Burr-Brown, "Dual, Isolated, Bi-Directional Digital Coupler", 2000, ISO150.

Zhou, Jianjun J., et al., "Monolithic Transformers and Their Application in a Differential CMOS RF Low-Noise Amplifier", IEEE Journal of Solid State Circuits, vol. 33, No. 12, pp. 2020-2027 (Dec. 1998).

Geen, M.W., et al., "Miniature Multilayer Spiral Inductors for GaAs MMICs", IEEE GaAs IC Symposium, pp. 303-306 (1989).

Ronkainen, H. et al., "IC Compatible Planar Inductors on Silicon", IEE Proc.—Circuits Devices Syst., vol. 144, No. 1, (Feb. 1997).

Knoedl, G., Jr., et al., "A Monolithic Signal Isolator", IEEE (1989).

Hewlett Packard, 40 ns Prop. Delay, SO-8 Optocoupler: Technical Data for HCPL-0710 (1997).

Kester W., "Practical Design Techniques for Sensor Signal Conditioning", Analog Devices, Inc., pp. 10.55-10.57 (1999).

Simburger, W., et al., "A Monolithic Transformer Coupled 5.W Silicon Power Amplifier with 59% PAE at 0.9 GHz", IEEE Journal of Solid-State Circuits, vol. 34, No. 12 (Dec. 1999).

Bourgeois, J.M., "PCB Based Transformer for Power MOSFET Drive", IEEE, pp. 238-244 (1994).

Banerjee and Kliger, "Micromachined Magnetics: a New Step in the Evolution of Isolation Technology", Electronic Engineering (Jun. 2000).

Analog Devices, Inc., "High Speed Digital Isolators, ADuM1100AR/ADuM1100BR", Rev. 0 data sheet (2001).

Sayani et al., "Isolated Feedback For Off-Line Switching Power Supplies with Primary-Side Control", IEEE pp. 203-211 (1998).
Analog Devices, Inc., "Low Cost, Miniature Isolation Amplifiers, AD202/AD204", Rev. B data sheet (1994).
Analog Devices, Inc., "High Speed, Logic Isolator With Power Transformer, AD260", Rev. 0 data sheet (1998).
Gediminas P. Kurpis, Chair, "The New IEEE Standard Dictionary of Electrical and Electronics Terms [Including Abstracts of All Current IEEE Standards]," IEEE St. 100-1992, Fifth Edition.
30(b)(6) Deposition of Timothy J. Dupuis, United States District Court in the District of Massachusetts, *Analog Devices, Inc.* vs. *Silicon Laboratories, Inc.*, Civil Action No. 06-12240(WGY), Oral and Videotaped Deposition of Timothy J. Dupuis-30(B)(6) Oct. 24, 2007, LiveNote World Service, p. 1, 62, 63, 204.
"Office Action", U.S. Appl. No. 09/872,779, Date Mailed: Apr. 24, 2002, 2 Cover Sheets (unnumbered), pp. 2-7.
"Amendment", Isolator for Transmitting Logic Signals Across an Isolation Barrier, U.S. Appl. No. 09/872,779, OIPE dated Jul. 30, 2002, pp. 1-10.
Plaintiff Analog Devices, Inc.'s Preliminary Infringement Contentions (May 25, 2007), pp. 1-7.
U.S. District Court in the District of Massachusetts, *Analog Devices, Inc.* v. *Silicon Laboratories, Inc.*, Civil Action No. 06-12240(WGY), "Declaration of Baoxing Chen, Ph.D.," signed Aug. 6, 2007, pp. 1-5.
U.S. District Court in the District of Massachusetts, *Analog Devices, Inc.* v. *Silicon Laboratories, Inc.*, Civil Action No. 06-12240(WGY), "Declaration of Baoxing Chen, Ph.D.," signed Jan. 9, 2008, pp. 1-3.
European Patent Office, Communication pursuant to Article 96(2) EPC, Application No. 01909157.8-1237, Analog Devices, Inc., dated Feb. 9, 2006, Cover Sheet (unnumbered), pp. 1-3.
U.S. District Court District of Massachusetts, *Analog Devices, Inc.* vs. *Silicon Laboratories, Inc.*, Civil Action No. 06-12240(WGY), Leave to File Granted on Jan. 17, 2008, "Silicon Labs' Summary Judgment Reply Brief", Cover Sheet (unnumbered), pp. i-ii, pp. 1-13.
Email dated Jan. 25, 2008 regarding Notice of Electronic Filing Notice, ECFnotice@mad.uscourts.gov, pp. 1-2.
"Office Action Summary", Date mailed Aug. 10, 2006, U.S. Appl. No. 10/214,883, SIL-00003343-00003351.
In the United States Patent and Trademark Office, "Amendment, Interview Summary and Request for Reconsideration," U.S. Appl. No. 09/838,520, dated Sep. 12, 2003, AD1000589-AD1000598, Cover Sheet (unnumbered), pp. 2-10.
U.S. Patent and Trademark Office cover sheet, U.S. Appl. No. 10/214,883,Mail Date May 29, 2007, "Notice of Abandonment", 2 pages (unnumbered).
"Standard Handbook for Electrical Engineers", Tenth Edition, Copyright 1968, by McGraw-Hill, Inc., 2 Cover Sheets (unnumbered), pp. 15-75, 15-84, and 15-85.
"Electronics Engineers' Handbook", Donald Christiansen, Editor in Chief, Fourth Edition, McGraw-Hill, Inc., 1996, 3 pages (unnumbered).
In the U.S. Patent and Trademark Office "Amendment, Interview Summary and Request for Reconsideration . . . ", U.S. Appl. No. 09/838,520, Cover Sheet (unnumbered), Sep. 10, 2003, pp. 2-10.
U.S. District Court District of Massachusetts, *Analog Devices, Inc.* vs. *Silicon Laboratories, Inc.*, Civil Action No. 06-12240 (WGY), Leave to File Granted on Oct. 4, 2007, "Silicon Labs' Claim Construction Sur-Reply Brief", pp. 1-15.
U.S. District Court in the District of Massachusetts, *Analog Devices, Inc.* vs. *Silicon Laboratories, Inc.*, Civil Action No. 06-12240(WGY), "Oral and Videotaped Deposition of Dr.Luke J. Turgeon, P.E., Jan. 9, 2008," pp. 1, 48-51, pp. 52-58, pp. 61-64, pp. 79-83, pp. 88-92, pp. 98-102, , pp. 103-105, pp. 114-116, pp. 118-120, pp. 199-200, pp. 232-234, pp. 240-246, pp.
Utility Patent Application Transmittal for U.S. Appl. No. 10/214,883, filed Aug. 8, 2002, SIL-00003826-0003864.
U.S. District Court District of Masschusetts, *Analog Devices, Inc.* vs. *Silicon Laboratories, Inc.*, Civil Action No. 06-12240(WGY), "Leave to File Granted Jan. 24, 2008, Silicon Labs' Response to Analog's Rebuttal of Silicon Labs' Statement of Facts Regarding Count V," Cover Sheet (unnumbered), pp. i, pp. 1-6.
U.S. District Court District of Massachusetts, *Analog Devices, Inc.* vs. *Silicon Laboratories, Inc.*, Civil Action No. 06-12240(WGY),
"Leave to File Granted Jan. 24, 2008, Reply to Analog's Counter Statement of Facts for Count V Motion", Cover Sheet (unnumbered), pp. i, pp. 1-12.
Claims Chart, "U.S. Patent Nos. 6,262,600, 6,525,566, 6,903,578, and 6,873,065 in view of U.S. Patent No. 4,785,345 to Rawls et al.," Exhibit 18 to Dec. 7, 2007 Neikirk Report, pp. 1-18.
U.S. District Court In The District of Massachusetts, *Analog Devices, Inc.* vs. *Silicon Laboratories, Inc.*, Civil Action No. 06-12240(WGY), "Oral and Videotaped Deposition of Dr. Luke J. Turgeon, P.E. Jan. 9, 2008, " p. 1, pp. 13-18, p. 209, pp. 60-61, pp. 67-69, p. 276.
U.S. District Court For The District of Massachusetts, *Analog Devices, Inc.* vs. *Silicon Laboratories, Inc.*, "Videotaped Desposition of David A. Hodges Ph.D., Thursday, Jan. 17, 2008", 9:35 A.M., p. 1, pp. 96-109.
U.S. District Court in The District of Massachusetts, *Analog Devices, Inc.* v. *Silicon Laboratories, Inc.*, Civil Action No. 06-12240(WGY), "Leave to File Granted Jan. 24, 2008, Declaration of Genetry C. McLean in Support of Silicon Labs' Partial Summary Judgment Reply Brief as to Count V", pp. 1-3.
Email From: ECFnotice@mad.uscourts.gov, sent: Friday, Jan. 25, 2008, To: CourtCopy@mad.uscourts.gov, pp. 1-2 regarding Notice of Electronic Filing.
Dean P. Neikirk, "Biography", Dec. 7, 2007, pp. 1-52.
Exhibit 10 to Dec. 7, 2007 Neikirk Report, U.S. Patent No. 5,781,077 to Leitch, pp. 1-18.
Exhibit 12 to Dec. 7, 2007 Neikirk Report, U.S. Patent No. 5,293,400 to Monod et al., pp. 1-13.
Exhibit 14 to Dec. 7, 2007 Neikirk Expert Report, U.S. Patent No. 5,701,037 to Weber et al., Cover Sheet (unnumbered); pp. 2-5.
Exhibit 16 to Dec. 17, 2007 Neikirk Report, Japanese Patent No. 57-132460 to Inanari, pp. 1-4.
Exhibit 20 to Dec. 7, 2007 Neikirk Report, U.S. Patent No. 6,262,600 to Haigh et al., pp. 1-11.
Burr-Brown, "A System Designer's Guide to Isolation Devices", Sensors, 1999, pp. SIL-00004907-SIL-00004913.
Exhibit 6 to Dec. 7, 2007 Neikirk Report, French Patent No. 2678670A to Serbanescu, pp. 1-14.
Exhibit 8 to Dec. 7, 2007 Neikirk Report, U.S. Patent No. 5,650,357 to Dobkin [Ex. 9], pp. 1-24.
Irvine, M.M., "Early Digital Computers at Bell Telephone Laboratories", IEEE Annals of the History of Computing, 2001, pp. 22-42.
Laughton et al., Electrical Engineer's Reference Book, Sixteenth Edition, Chapter 14, Newnes, 2003, pp. 3 cover sheets (unnumbered), pp. 14/6-14/9.
IEEE Standard for a High Performance Serial Bus, IEEE Std 1394-1995, 1996, pp. SIL-00006001-SIL-00006392.
Charles H. Roth, Jr., Fundamentals of Logic Design, Third Edition, 1985, 2 pages (unnumbered), pp. 254-256.
Exhibit 70 to Dec. 7, 2007 Neikirk Report, ADI Isolation Amplifier AD203SN, pp. 1-4.
Streetman, Ben G., Solid State Electronic Devices, Second Edition, Prentice-Hall Series in Solid State Physicl Electronics, 1980, 2 Cover Sheets (unnumbered), pp. 346-347.
Charles H. Roth, Jr., Fundamentals of Logic Design, "Discrete and Integrated Circuit Logic Gates", Third Edition, 1985, 2 CoverSheets (unnumbered), pp. 613-616.
Dual Digital Isolators, Texas Instruments, 2006-2007, Cover Sheet (unnumbered), pp. 2-19, Addendum, pp. 1-2, Pack Materials, pp. 1-2, Plastic Small-Outline Package, 2 pages (unnumbered).
3.3V/5-V High-Speed Digital Isolators, Texas Instruments, 2006-2007, pp. 1-18, Addendum, pp. 1-2, Pack Materials, pp. 1-2, Plastic Small-Outline Package, 2 pages (unnumbered).
Quad Digital Isolators, Texas Instruments, 2007, cover sheet (unnumbered), pp. 2-19, Addendum, pp. 1-2, Pack Materials, pp. 1-2, Plastic Small-Outline Package, 2 pages (unnumbered).
Chen et al., "High Speed Digital Isolators Using Microscale On-Chip Transformers", Exhibit 314, Oct. 31, 2007, pp. AD1002178-AD1002183.
Business Wire: Pulse's New Miniature Transformers are Optimized for Wideband RF Applications, Jul. 26, 2000, pp. 1-2.

Park et al., "Packaging Compatible Microtransformers on a Silicon Substrate", IEEE Transactions on Advanced Packaging, vol. 26, No. 2, May 2003, pp. 160-164.

Hermann et al., "Magnetically Coupled Linear Isolator", IEEE Transactions on Magnetics, vol. 33, No. 5, Sep. 1997, pp. 4029-4031.

Nihtianov, Stoyan, "Magnetogalvanic Approach to Isolation of Analog Circuits", IEEE Transactions on Instrumentation and Measurement, vol. 43, No. 4, Aug. 1994, pp. 677-680.

Silicon Laboratories, [Si8440/41/42/45, "Quad-Channel Digital Isolator", Rev.0.6 Aug. 2007, cover sheet (unnumbered), pp. 2-30.

Silicon Laboratories, Si8430-31/35, "Triple-Channel Digital Isolator", Rev. 0.3 Aug. 2007, cover sheet (unnumbered), pp. 2-30.

Email from Park, Ted, Sent Wednesday, Aug. 9, 2006, To ODoherty, Pat, Subject RE: Samsung SDI iCoupler Business Update, pp. ADI28361-ADI128367.

Email from Tim J. Dupuis, Sent Tuesday, Apr. 4, 2006, To Bruce Webb; Walt S. Schopfer, Subject Isolator Design Reviews, pp. SIL-0018097-SII-0018261.

U.S. District Court in The District of Massachusetts, *Analog Devices, Inc.* vs. *Silicon Laboratories, Inc.*, Civil Action No. 06-12240(WGY), "Oral and Videotaped Deposition of Timothy J. Dupuis, Oct. 24, 2007", p. 1, pp. 72-75, pp. 126-127, pp. 169-172, p. 204.

2 datasheets, User: dholberg, Date: Wed May 9 14:07:42 2007, Plot Size: 5.09×10.50 inches, Magnification: 174.36X, Library: Isolator, Cell: si8440, View: layout, Plot Area: (0.0.0.0) (741.311529.61), 2 pages (unnumbered).

U.S. District Court for The District of Massachusetts, *Analog Devices, Inc.* vs. *Silicon Laboratories, Inc.*, "Videotaped 30(b) (6) Deposition of Analog Devices by Ronn Kliger and of Ronn Kliger Individually," Wednesday, Oct. 31, 2007, 9:51 a.m., p. 1, p. 20, pp. 43-51, p. 234.

"Supplemental Amendment", In re Patent Appl. of: Geoffrey T. Haigh, et al., U.S. Appl. No. 09/872,779, Title: Isolator for Transmitting Logic Signals Across an Isolation Barrier, pp. 1-3, Fax Cover Sheet Hale and Dorr LLP, p. 1, dated Aug. 19, 2002.

Exhibit 104 to Jan. 4, 2008 Neikirk Report, WO 99/21332 to Haigh [Ex. 42] et al., pp. 1-7.

S. Wolf, Silicon Processing for the VLSI Era, vol. 2-Process Integration, Latice Press, 1990, 2 Cover Sheets (unnumbered), pp. 66-69.

Chiu et al., "Thin-Film Inductive Heads", IBM, J. Res. Develop., vol. 40, No. 3, May 1996, pp. 283-300.

TSang et al., Design, fabriation, and performance of spin-vlve read heads for magnetic recording applications, IBM J. Res. Develop, vol. 42, No. 1, Jan. 1998, pp. 103-116.

Exhibit 117 to Jan. 4, 2008 Neikirk Report, U.S. Patent No. 4,024,452 to Seidel [Ex. 117], pp. 1-10.

Tarlton Fleming, Ed., "Isolation amplifiers break ground loops and achieve high CMRR", EDN, Dec. 1987, pp. 97-102, and p. 5.

U.S. District Court for the District of Massachusetts, *Analog Devices, Inc.* vs. *Silicon Laboratories, Inc.*, Civil Action No. 06-12240-WGY, "Markman Hearing", Nov. 14, 2007, pp. 1-44.

Exhibit 10 to Dec. 7, 2007 Turgeon Report, U.S. Patent No. 4,785,345 to Rawls et al., pp. 1-7.

S.M. Sze, Physics of Semiconductor Devices, Second Edition, John Wiley & Sons, 1981, 2 Cover Sheets (unnumbered), and p. 1.

Exhibit 3, Wedlock et al., "Electronic Components and Measurements", Prentice-Hall, Inc., 1969, 5 Sheets (unnumbered), and p. 89.

Exhibit 6, miscellaneous publications including "Isolation in MedicalApplications", "Isolation Technologies for Reliable Industrial Measurements", "Medical devices demand stringent isolation techniques", "Electronics Technology Elite Compete for Industry's Highest Honors as EE Times Announces Finalists for 2007 EE Times ACE Awards", 41 pages (unnumbered).

Exhibit 7, IEEE 100 The Authoritative Dictionary of IEEE Standard Terms, Seventh Edition, Standards Information Network, IEEE Press, 2000, 3 pages (unnumbered), and pp. 168, 351, 592, 911, and 1123.

Exhibit 8, Japanese Patent Application No. S56-18236, published Aug. 16, 1982, entitled "Insulation Method", translation to English, 9 pages (unnumbered).

McGraw-Hill Dictionary of Scientific and Technical Terms, Fifth Edition, 1994, 3 pages (unnumbered), and pp. 1797-1798..

Claims Chart, U.S. Patent No. 7,075,329 in view of Kilger, R. et al. "Micromachined magnetics: a new step in the evolution of isolation technology," Electronic Engineering, Jun. 2000, pp. 27-32, 4 pages (unnumbered).

Exhibit H, "The American Heritage Dictionary of the English Language", American Heritage Publishing Co., 1999, 3 Cover Sheets (unnumbered), p. 516.

Exhibit I, "Encarta World English Dictionary", St. Martin's Press, 1999, 3 Cover Sheets (unnumbered), p. 699.

Exhibit J, The Concise Oxford Dictionary, Oxford University Press, 1999, 3 Cover Sheets (unnumbered), p. 556.

Rudolf F. Graf, Modern Dictionary of Electronics, Seventh Edition, Newnes, 1999, 7 pages (unnumbered).

European Patent Office, "Decision to refuse a European Patent application", Application No. 01 909 157.8-1237, 13 pages, dated Mar. 15, 2007 (unnumbered).

Analog Devices, "Frequently Asked Questions", Isolation, iCoupler Technology, and iCoupler Products (Mar. 2006), pp. ADI002323-ADI002332.

Digital Isolation, Power Electronics Europe, "Isolation with Waferscale Transformers", Issue 6, 2005, pp. 40-43.

Philip Babcock Gove, Ph.D., Editor in Chief, Webster's Third New International Dictionary of the Engligh Language Unabridged, Konemann Verlagsgesellschaft MBH, 1993, 3 pages (unnumbered), and p. 1680.

European Patent Office, Provision of a copy of the minutes in accordance with Rule 76(4) EPC, Patent Application No. 01 909 157.8-1237, Mailed Mar. 15, 2007, 9 pages (unnumbered).

In The U.S. District Court for The District of Massachusetts, No. 1:06-CV-12240 WGY, *Analog Devices, Inc.* vs. *Silicon Laboratories, Inc.*, "Videotaped Deposition of Baoxing Chen, Ph.D.", Wednesday, Sep. 5, 2007 9:43 a.m., Proskauer Rose LLP, pp. 1, 98-101, and 267.

*Analog Devices, Inc.* v. *Silicon Laboratories, Inc.*, U.S.D.C. Mass., Civil No. Action No. 06-12240(WGY), "Plaintiff Analog Devices, Inc.'s Preliminary Infringement Contentions (May 25, 2007)", pp. 1-28.

Circuit—Definitions from Dictionary.com, 14 results for: circuit, p. 2 of 10, http://dictionary.reference.com/browse/circuit, Sep. 28, 2007.

Datasheet, "Welcome to the 17th Annual EDN Innovation Awards", Reed Business Information, 1997-2007, 2 pages.

One sheet labelled "Power Electronics Europe", dated Jul. 2005, (unnumbered).

Information sheet, "powerZONE Products fo rthe week of May 26, 2003", pp. 1-2.

Press Release, "Emerson Selects Analog Devices' Digital Isolation Technology for Industrial Systems; ADI's iCoupler Technology Enables Low-Cost Signal Isolation in High-Temperature Environments", dated Sep. 24, 2003, Business Wire, pp. 1-2.

Press Release, Mentor Graphics, "EE Times Names ACE Finalists", EETIMES Online, dated Jan. 15, 2007, pp. 1-3.

Press Release, Global Sources, EE TimesAsia, New Products, "ADI digital isolators reduce per-channel costs", dated Jun. 19, 2003, p. 1 of 1.

\* cited by examiner

CHIP-SCALE COILS AND ISOLATORS BASED THEREON

CROSS-REFERENCE TO RELATED APPLICATIONS

This application is a continuation of U.S. patent application Ser. No. 10/214,883, filed Aug. 8, 2002 now abandoned, which is a continuation-in-part of Ser. No. 09/838,520, filed Apr. 19, 2001 now U.S. Pat. No 6,873,065, which is a continuation-in-part of Ser. No. 09/557,542, filed Apr. 25, 2000 now U.S. Pat. No. 6,291,907, which is a continuation of Ser. No. 09/118,032, filed Jul. 17, 1998, now U.S. Pat. No. 6,054,780, which claims priority from provisional application No. 60/063,221 filed Oct. 23, 1997. These priority documents are expressly incorporated by reference for all purposes.

FIELD OF THE INVENTION

This invention relates to coils as well as to coil-based or partially coil-based isolator circuitry and structures for isolating electronic signals. Such isolators are used, for example, to interface and galvanically isolate sensor signals in a process control system, or between microcontrollers and other signal sources and transducers or other devices using those signals.

BACKGROUND OF THE INVENTION

In a variety of environments, such as in process control systems, analog or digital signals must be transmitted between diverse sources and circuitry using those signals, while maintaining electrical (i.e., galvanic), isolation between the sources and the using circuitry. Isolation may be needed, for example, between analog sensors and amplifiers or other circuits which process sensor outputs; or between microcontrollers, on the one hand, and sensors or transducers which generate or use microcontroller input or output signals, on the other hand. Electrical isolation is intended, inter alia, to prevent extraneous transient signals, including common-mode transients, from inadvertently being processed as status or control information, or to protect equipment from shock hazards or to permit the equipment on each side of an isolation barrier to be operated at a different supply voltage, among other known objectives. One well-known method for achieving such isolation is to use optical isolators that convert input electrical signals to light levels or pulses generated by light emitting diodes (LEDs), and then to receive and convert the light signals back into electrical signals. Optical isolators present certain limitations, however: among other limitations, they are rather non-linear and their current transfer ratios can vary over a large range with input voltage, temperature and lifetime, presenting challenges to the user and generally making them unsuitable for accurate linear applications; they require significant space on a card or circuit board; they draw a large current; they do not operate well at high frequencies; and they are very inefficient. They also provide somewhat limited levels of common mode transient immunity. To achieve and common mode transient immunity, opto-electronic isolators have been made with some attempts at providing an electrostatic shield between the optical transmitter and the optical receiver. However, a conductive shield which provides a significant degree of common mode transient immunity improvement is not sufficiently transparent for use in this application.

One isolation amplifier avoiding the use of such optical couplers is U.S. Pat. No. 5,831,426 to Black et al, which shows a current determiner having an output at which representations of input currents are provided, having an input conductor for the input current and a current sensor supported on a substrate electrically isolated from one another but with the sensor positioned in the magnetic fields arising about the input conductor due to any input currents. The sensor extends along the substrate in a direction primarily perpendicular to the extent of the input conductor and is formed of at least a pair of thin-film ferromagnetic layers separated by a nonmagnetic conductive layer. The sensor can be electrically connected to electronic circuitry formed in the substrate, including a nonlinearity adaptation circuit to provide representations of the input currents of increased accuracy despite nonlinearities in the current sensor, and can include further current sensors in bridge circuits. Another non-optical isolation amplifier, for use in a digital signaling environment, is described in U.S. Pat. No. 4,748,419 to Somerville. In that patent, an input data signal is differentiated to create a pair of differential signals that are each transmitted across high voltage capacitors to create differentiated spike signals for the differential input pair. Circuitry on the other side of the capacitive barrier has a differential amplifier, a pair of converters for comparing the amplified signal against high and low thresholds, and a set/reset flip-flop to restore the spikes created by the capacitors into a logic signal. In such a capacitively-coupled device, however, during a common mode transient event, the capacitors couple high, common-mode energy into the receiving circuit. As the rate of voltage change increases in that common-mode event, the current injected into the receiver increases. This current potentially can damage the receiving circuit and can trigger a faulty detection. Such capacitively coupled circuitry thus couples signals that should be rejected. The patent also mentions, without elaboration, that a transformer with a short R/L time constant can provide an isolation barrier, but such a differential approach is nonetheless undesirable because any mismatch in the non-magnetic (i.e., capacitive) coupling of the windings would cause a common-mode signal to appear as a difference signal.

In a coil-based isolator, an input signal is coupled (directly or indirectly) from an input node to a coil or coils which generate(s) a magnetic field(s) that is(are) coupled to a gavanically isolated field-receiving or field-sensing element(s). An output circuit(s) coupled to the field-receiving element(s) converts the received field variations to an output signal corresponding to the input signal. The coupling from input node to input-side coil(s) may be made through elements or driving circuits that drive the coil(s) with signals derived from the input signal and not the same as the input signal.

Typically, there are two classes of coil-based isolators, depending on the nature of the field-receiving elements. The field-receiving elements may be another coil(s) or a type of magneto-resistive (MR)/giant-magneto-resistive (GMR) element(s) (which are collectively referred to herein as MR elements unless the need appears to distinguish them). If the field-receiving element(s) is(are) a coil(s), then the field-generating and field-receiving coils form transformers. With respect to coil-based isolators, we shall use the terms "winding" and "coil" interchangeably.

In transformer-based isolators, a Faraday shield may be interposed between the primary and secondary windings. The input signal is referenced to a first ground, or reference potential, and the output signal is referenced to a second ground, or reference potential. The Faraday shield also is referenced to the second ground. Common mode transients are capacitively coupled from the field generator (i.e., primary winding) into the Faraday shield and therethrough to the second ground, instead of into the corresponding field-receiving elements (i.e., secondary windings). Further, two Faraday shields may be disposed in spaced relationship between the transformer windings. In such an arrangement, a first Faraday shield usually is at the first reference potential and a second Faraday shield usually is at the second reference potential.

The isolation barrier may be formed on one or two silicon die, as shown in Application Serial No. 838,520, and can be formed from one or more pairs of field-generating and field-receiving elements, in each case preferably creating a vertically stacked structural arrangement with a dielectric (and in the case of windings, a Faraday shield) between the field-generating and field-receiving elements, for electrical isolation.

Such, an isolator may be monolithically fabricated. As disclosed in U.S. patent application Ser. No. 09/838,520, either one die or two may be used. An embodiment is shown therein with a complete isolator formed monolithically on a single die.

With appropriate driver and receiver circuits, embodiments of the isolator are useful for either analog signals or digital signals. Exemplary driver and receiver circuits for each type of signal also were shown in said application, though other driver and receiver circuits may be used, of course.

A need exists, however, to reduce the size and cost of such coil-based isolators, without degrading performance and without requiring greater power consumption. The cost of such isolators is highly dependent on semiconductor wafer fabrication costs and wafer area requirements.

SUMMARY OF THE INVENTION

Despite the benefits of the foregoing isolator designs, with respect to the coil-type isolator, manufacturing costs are still higher than is desired in many situations. A cost savings can be achieved by fabricating the coils (and, if used, MR elements) in, on or above a substrate which contains at most only input or output circuitry of the isolator, and preferably neither input nor output circuitry. The area requirements for the input circuitry and output circuitry are less than the area required by the coils. Therefore, when input and/or output circuitry is fabricated on the same substrate as at least one of the coils, the coil(s) will be determinative of the size of the substrate (die) which is required. Since cost is a direct function of die area requirements, coil size thus strongly influences the cost of manufacturing an isolator. Additionally, many of the expensive semiconductor processing steps used to create the input and/or output circuitry are unnecessary for coil fabrication and are essentially wasted on most of the die area. At the same time, some of the coil fabrication steps, usually performed in "post processing" operations after the circuitry is created, may be deleterious to the circuitry so the circuitry must be protected during coil manufacture. Hence, certain cost savings may result from only forming the input or output circuitry on the same substrate as the coil(s) and greater savings result from fabricating the coil(s) on a substrate of its (their) own, separate from the input and output circuitry; the latter reduces the cost of fabricating the circuitry as well as the cost of fabricating the transformer(s); simpler, more efficient manufacturing processes can be used to make the transformer, and the input and output circuits can be fabricated on dedicated wafers. Further, some of the processing methods which desirably would be used to fabricate the coils could, in fact, be problematic when the coils and circuitry are on the same substrate. Consequently, other, less desirable methods have to be used to fabricate the coils when input and/or output circuitry is made on the same substrate with the coils.

The cost savings increase still further for multi-channel isolators.

Accordingly, coil-based isolator structures are illustrated wherein coil windings are formed in or on (including above) a substrate which does not include some or all of the driver (i.e., input) or receiver (i.e., output) circuits.

This arrangement allows the substrate supporting the coil (s) to be made of an insulating material such as a glass, rather than a semiconductor material. In this way, when the field-receiving element is a coil, forming a transformer with the field-generating coil, improved transformer performance is obtainable. That is, such transformers are well-suited for dual direction, symmetrical drive/receive operation. Coil-substrate capacitance is reduced, there is less substrate loss and other parameters, such as creepage, are improved.

In a first aspect, there is provided a signal isolator comprising a first substrate; a first transformer formed on the first substrate; an input circuit operatively connected to drive the transformer in response to a received input signal; an output circuit operatively connected to generate an output signal responsive to a signal from the transformer; and wherein at least one of the input circuit and the output circuit is not formed on the first substrate. The transformer may include a first winding disposed in or on the first substrate and a second winding disposed above the first winding and electrically insulated from the first winding. At least one of the input circuit and the output circuit may be formed in or on a semiconductor substrate which is not the first substrate. In some embodiments, the input circuit is formed in or on a first semiconductor substrate and the output circuit is formed in or on a second semiconductor substrate. And in some embodiments, either the first semiconductor substrate or the second semiconductor substrate is the same as the first substrate. Optionally, there are formed on or in the first substrate one or more elements other than the first transformer, which elements are not part of the input circuit or output circuit. The transformer may comprise a first winding disposed on or in a first surface of the first substrate and a second winding disposed on or in an opposing second surface of the first substrate. As a desirable alternative, the first substrate may be formed of a material resistivity substantially higher than 10 ohm-cm. In some embodiments, an insulation material disposed between windings of the transformer.

A transformer as described may include a first, bottom winding and a second, top winding and a layer of dielectric material is disposed on a surface of the first substrate between the substrate and the bottom winding of the transformer. The input circuit may be operatively connected to drive the second winding and the output circuit may be operatively connected to receive a signal from the first winding responsive to the drive from said input circuit. The isolator may further include a second input circuit operatively connected to drive the first winding and a second output circuit operatively connected to receive a signal from the second winding responsive to the drive from the second input circuit. The input circuit may be operatively connected to drive the first winding and the output circuit may be operatively connected to receive a signal from the second winding responsive to the drive from said input circuit.

According to another aspect, there is provided a multi-channel isolator in which two or more channels are provided for communicating in opposing directions, comprising a first semiconductor substrate containing input circuitry for channels of first directionality and output circuitry for channels of second, opposing directionality; a second semiconductor substrate containing output circuitry for channels of first directionality and input circuitry for channels of second directionality; and a third substrate containing one or more transformers each with first windings in or on the third substrate and with second windings disposed above the first windings and with interconnections from the first substrate circuitry to the first windings and from the second substrate circuitry to the second windings. To the extent there is no incompatibility, such an isolator may include any of the features discussed above.

According to yet another aspect, there is shown a signal isolator comprising a first substrate; a coil formed in or on the first substrate for use in generating a magnetic field; a magnetic field-receiving element formed under or over the coil and spaced therefrom by an insulator; an input circuit operatively connected to drive the coil in response to a received input signal; an output circuit operatively connected to generate an output signal responsive to a signal from the field-receiving element; and wherein neither the input circuit nor the output circuit is formed on the first substrate. Optionally, the field-receiving element may include at least one MR element.

Further aspects of the invention include corresponding methods for forming, or assembling, such isolators.

The foregoing and other features, advantages and alternative embodiments of the invention, will be more readily understood and become apparent from the detail description which follows, which should be read in conjunction with the accompanying drawings and claims. The detailed description will be understood to be exemplary only and is not intended to be limiting of the invention.

DETAILED DESCRIPTION

As this invention improves upon that shown in U.S. patent application Ser. No. 09/838,520, we shall first review appropriate portions of the disclosure from that application. Some of those portions relate to isolators which use elements other than coils to establish the isolation barrier, but they show input and output circuitry and signals usable with transformer-based isolators, as well.

Figure 1:
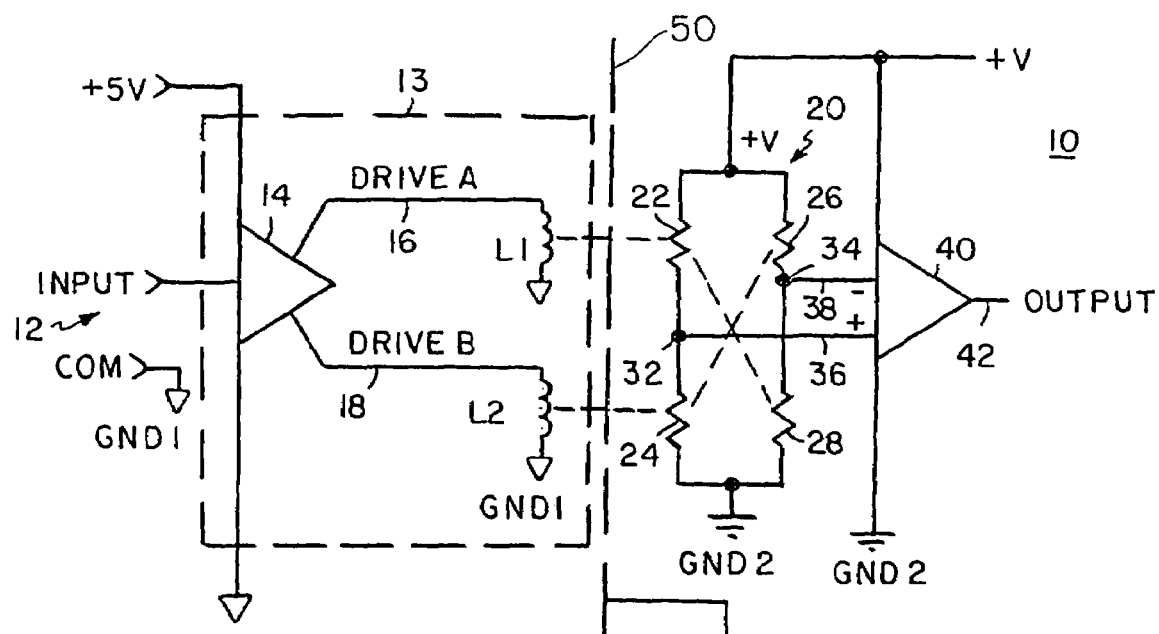
FIG. 1 is a schematic circuit diagram for a first exemplary implementation of a non-optical isolator as taught in application Ser. No. 09/838,520.

An exemplary implementation of an isolator 10 using coil-type field-generating and MR field-sensing (receiving) elements is illustrated schematically in FIG. 1. An input voltage is supplied at port 12 to a magnetic field generator 13, comprising an input driver 14 and one or more coils L1, L2. Driver 14 supplies output signals DRIVE A and DRIVE B on lines 16 and 18, respectively, to respective coils L1 and L2. Each of coils L1 and L2 generates a magnetic field which is sensed by a bridge 20 formed by MR elements 22, 24, 26 and 28. Elements 22 and 24 are connected in series across the supply rails as are elements 26 and 28. The bridge provides a differential output across nodes 32 and 34 at the respective junctions between resistors 22 and 24 on the one hand, and 26 and 28 on the other. Node 32 supplies a first signal RCVDC on line 36 to a non-inverting input of a differential receiver 40 and node 34 supplies a second received signal RCVDD on line 38 to the inverting input of the receiver 40. The output of the isolator appears on line 42 at the output of receiver 40. Since galvanic isolation of the output from the input is a principal objective, the input is referenced to a first ground, GND 1, and the output is referenced to a second ground, GND2. A Faraday shield, connected to ground GND2, is interposed between the coils L1, L2, on the one hand, and bridge 20, on the other. Faraday shield 50 provides electrostatic isolation between the coils and the MR bridge while allowing the magnetic fields generated by the coils to pass through to the MR elements of the bridge. Specifically, the field generated by coil L1 passes through elements 22 and 28 while the field generated by coil L2 passes through the elements 24 and 26.

For use as an analog signal isolator, the driver 14 may typically provide signals DRIVEA and DRIVEB as a pair of differential output signals. Some wave-shaping or signal conditioning may be applied in driver 14 or in receiver 40, as appropriate to the applications.

Figure 2:
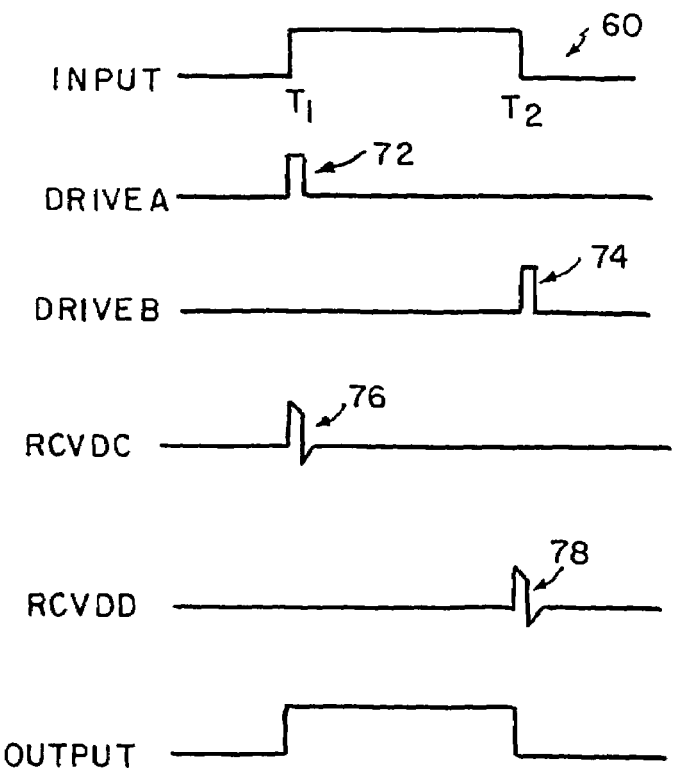
FIG. 2 is a waveform diagram illustrating operation of the circuit of FIG. 1 as a digital signal isolator.

For use as a digital signal isolator, operation of isolator 10 circuit may be understood with reference to the waveforms of FIG. 2. In FIG. 2, it is assumed that the input signal is a voltage having a waveform representing a logic signal illustrated at 60. Prior to Time T1, signal 60 is low. At time T1, the input goes from a low to a high value and driver 14 presents a pulse 72 of a short, predetermined width and amplitude in the signal DRIVEA. At the falling edge of the input signal, at time T2, a comparable pulse 74 is generated by driver 14 in the signal DRIVEB. The corresponding received signals detected at nodes 32 and 34 are shown in the waveforms for the signals RCVDC and RCVDD. Receiver 40 is a comparator with a slight amount of hysteresis, which essentially operates as a bistable element. The "pulse" 76 generated in the RCVDC signal by DRIVEA pulse 72 sets the output signal high, and the pulse 78 generated in the RCVDD signal generated by the DRIVEB pulse 74 resets the output signal to a low level. Thus, the output signal recreates the input signal faithfully.

The amount of hysteresis employed in receiver 40 preferably is selected to assure a high reliability of set and reset operation of the receiver while obtaining as much insensitivity to noise as possible.

Figure 3:
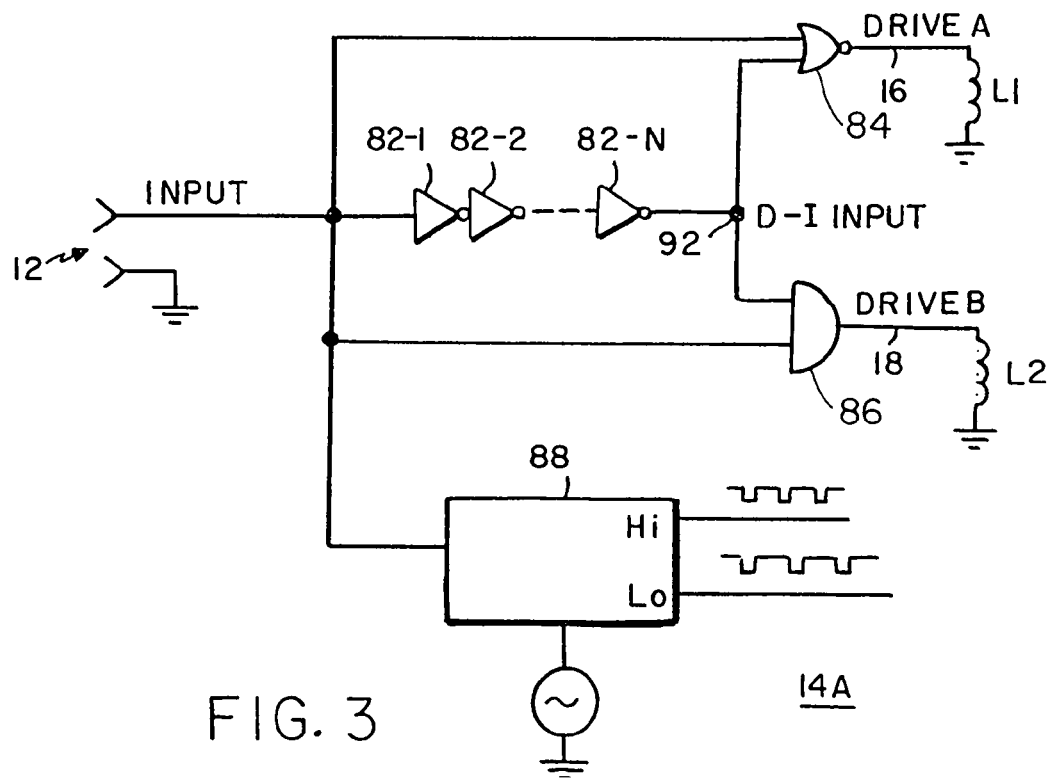
FIG. 3 is a logic diagram for a driver circuit suitable for use in the digital isolator of FIG. 2.

While numerous circuits may be employed for driver 14 in the digital signal processing mode, an exemplary circuit 14A is shown in FIG. 3. The input signal applied to port 12 is supplied to an odd number of inverters 82-1 through 82-N (three inverters may suffice), as well as to one input of each of NOR-gate 84 and AND gate 86, as well as to pulse generator 88. (Pulse generator 88 is optional and its use is described in the incorporated patent. A second input of each of gates 84 and 86 is supplied from the output of the inverter string 82-1 through 82-N. The output of NOR-gate 84 supplies the DRIVEA signal on line 16 to coil L1 and the output of AND GATE 86 supplies the DRIVEB signal on line 18 to coil L2.

Figure 4:
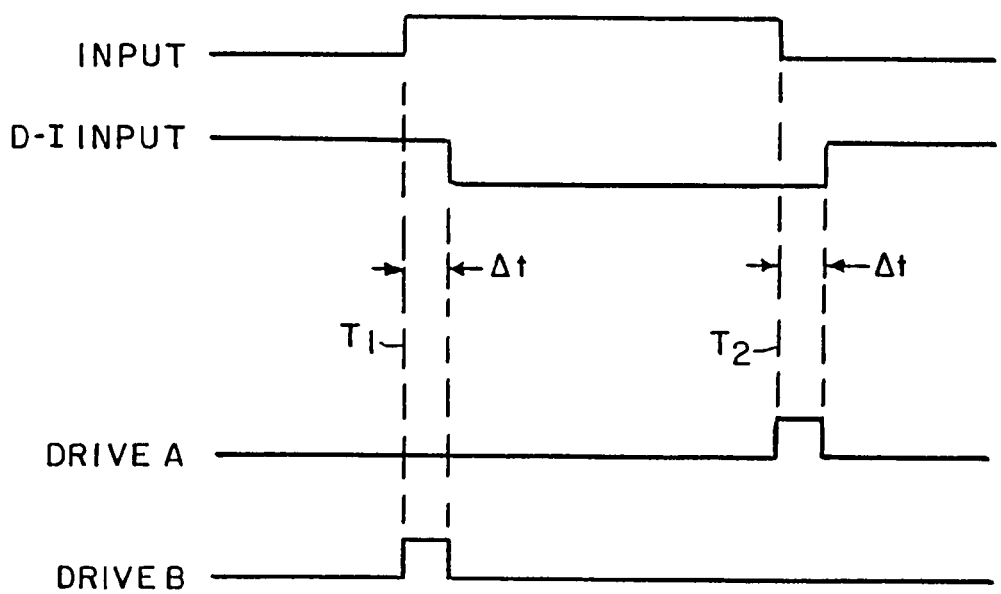
FIG. 4 is a waveform diagram illustrating operation of the circuit of FIG. 3.

The operation of the circuit of FIG. 3 is now explained with reference to the waveforms of FIG. 4. The input signal again is assumed to be a logic signal which is high between times T, and T2. The delayed and inverted state of the input signal which appears at node 92, termed D-1 INPUT, thus is a copy of the input signal, inverted and delayed by the propagation delay of the inverter chain 82-1 through 82-N, which delay is labeled in the drawing as Δt. It is assumed that Δt is much smaller than the interval from T, through T2. For example, Δt is typically just a few nanoseconds. The output from NOR-gate 84 consequently is high except during interval from T2 to T2+Δt; and the output of the AND gate 86, the DRIVEB signal, is high except in the interval from T1 to T1+Δt.

Naturally, when the isolator employs a single transformer with a single winding for the primary, the drive circuitry and signals may have to be different from those shown for the dual-coil primary arrangement. One satisfactory approach may be to apply the DRIVEA and DRIVEB signals, or close counterparts thereof, to the opposite ends of the primary winding. On the secondary side of the transformer, when a single winding is employed, the receiver circuitry must also be adapted to that arrangement. That is, the receiver circuitry must be connected either to each end of the secondary winding or one end of the winding can be grounded and the receiver connected to only one end of the secondary winding.

Figure 5:
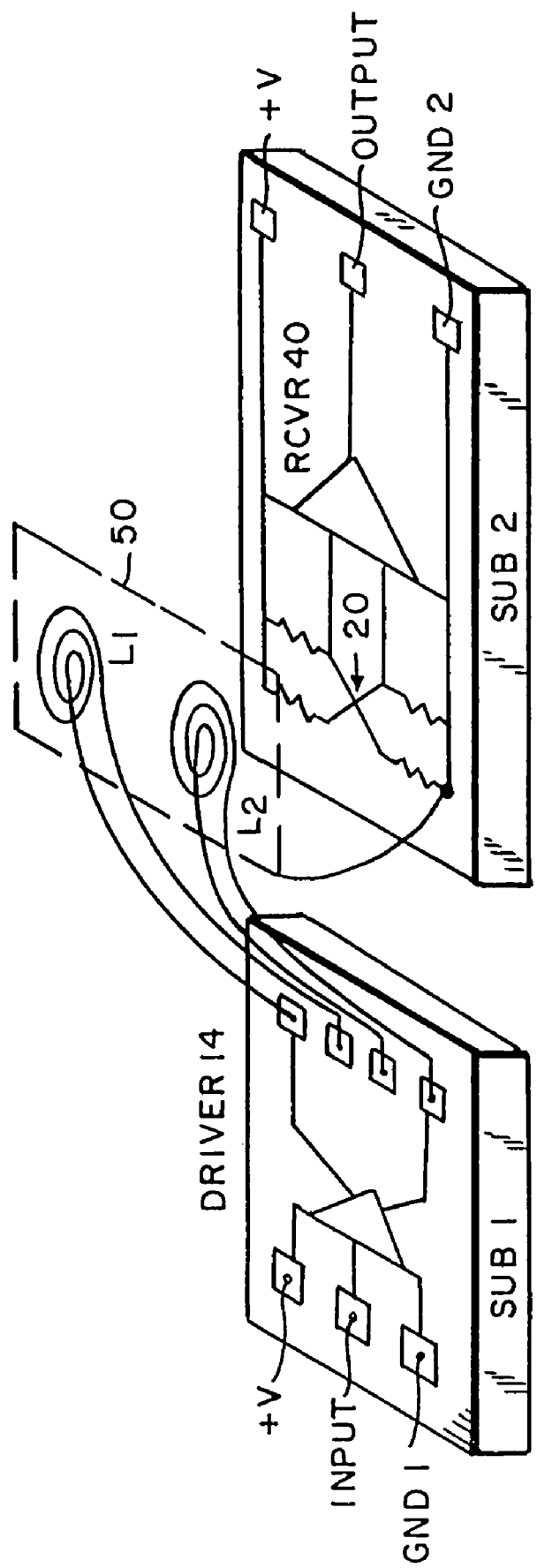
FIGS. 5 and 8 are diagrammatic, exploded views showing conceptually how an isolator as disclosed in application Ser. No. 09/838,520 may be fabricated using integrated circuit manufacturing techniques, with MR elements receiving a magnetic field in FIG. 5, and a magnetic field detected by a second pair of coils in FIG. 8.

A diagrammatic illustration, as shown in FIG. 5, is useful to illustrate conceptually how such an isolator may be fabricated monolithically, continuing with an embodiment having two coils for field generation and two coils for field sensing (i.e., a pair of transformers). Such fabrication may occur with the driver 14 on a first substrate, SUB 1, and with the coils (L1, L2), Faraday shield 50, MR sensor and receiver 40 on a second substrate, SUB 2, or with the entire apparatus on a single substrate (i.e., where SUB 1 and SUB 2 are the same substrate), as more fully explained below.

Figure 6:
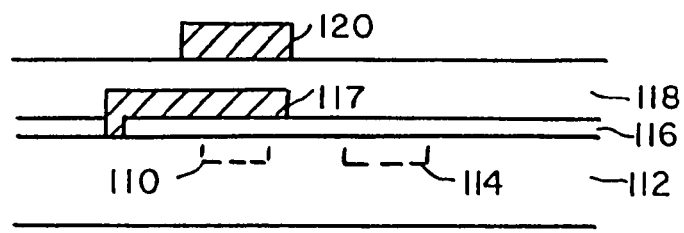
FIG. 6 illustrates in a simplified side view, schematically, the layers of materials that form monolithically the elements of such an isolator.

Without indicating any patterning, FIG. 6 shows a schematic side view of the layers of materials that form monolithically the coils, Faraday shield, sensor and receiver of FIG. 5. The resistive sensors 110 are formed on or in a semiconductor substrate 112 along with the receiver circuitry indicated generally in area 114. A thin layer of oxide 116 is then formed over the substrate. This is followed by a metallization layer which connects to the substrate (i.e., the input's ground) and which provides the Faraday shield; appropriate positioning and area considerations are discussed below). A thick oxide layer 118 is applied over the metallization. On top of the thick oxide layer 118 there is formed a metallization layer 120 which is patterned to form coil L1 and L2 in appropriate geometric relationship and placement over sensor elements 110.

Figure 7:
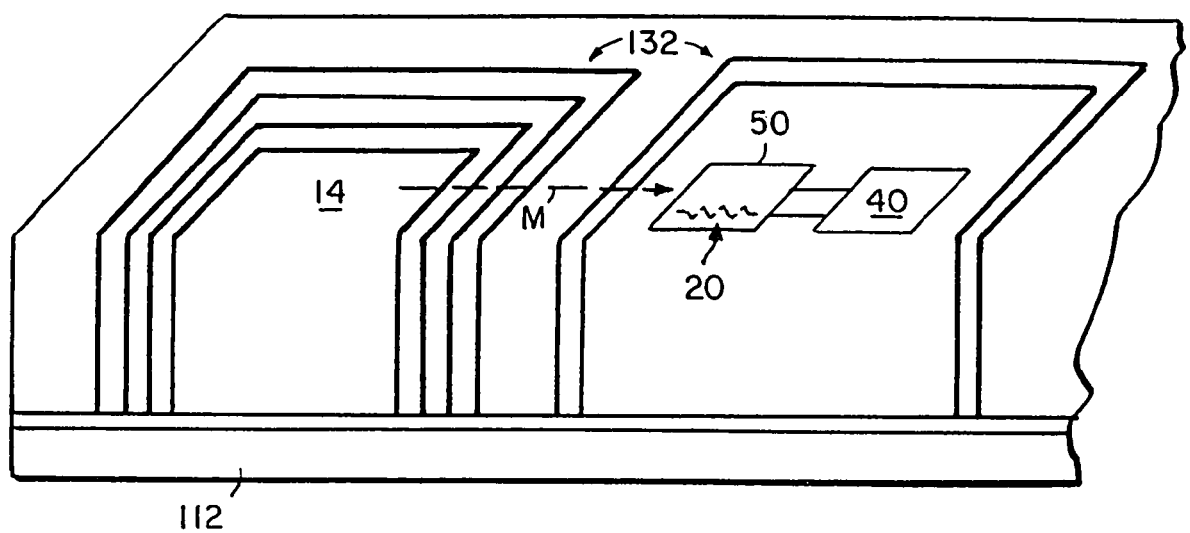
FIG. 7 is a simplified diagrammatic, isometric view, partially in cross section, showing how a complete isolator, with an input driver circuit, may be fabricated monolithically on a single substrate.

Turning to FIG. 7 there is generally illustrated a single substrate embodiment containing the entire isolator. The driver circuitry 14 is electrically isolated from the sensors 20 and receiving circuitry 40 by building the entire isolator structure on an oxide layer formed over the substrate 112 and then surrounding the driver and/or sensors and receiver by one or more dielectric isolation zones, also called trenches, 132 which are filled during fabrication with an oxide or other dielectric material. To avoid obfuscation, the coils are not drawn but are represented operatively by the dashed line M, representing a magnetic linking.

Using a trench-isolated IC manufacturing process, approximately one kilovolt of isolation is provided per micrometer of oxide (or nitride or similar dielectric) thickness. With a base oxide layer and trenches three micrometers thick, approximately three kilovolts of isolation will be achieved. This is satisfactory for a large number of typical applications and it can be increased for other applications.

A typical opto-isolator draws a steady current of about 3-15 mA for high-speed digital operation, using a supply voltage in the three- to five-volt range. By contrast, the exemplary apparatus of FIG. 2 et seq. draws very little current except during the drive pulses. With a 50 MHz clock speed, and a pulse width, Δt, of one nanosecond, if the current drawn during the pulse is 10 mA, the average current is only 0.5 mA. At low clock speeds or data rates such as a 50 Hz rate as might be used in medical electronics, for example, the drive pulses consume an average current of only about 0.5 microamps. Even considering the current required for operating the receiver and quiescent driver circuits, the entire apparatus may be operated on only about 10-12 microamps. Additionally, magnetoresistive elements are very fast to respond to changes in magnetic field, reacting in the nanosecond domain. As a result, such an isolator should be much faster (e.g., ten times faster) than an opto-isolator.

For GMR elements, the change in resistance over the range of magnetic field from a zero field to a saturation field is only about 1-4 percent. When a five-volt power supply is used, this means the GMR elements produce only about a 50-200 millivolt signal swing. The capacitive coupling between the coils and the GMR elements may be about 0.1-1 pF without the Faraday shield. If a transient common mode voltage is imposed on driver 14, it is capacitively coupled from the output of drive 14 into Faraday shield 50, and the capacitive current is coupled to ground.

Numerous design considerations must be taken into account when assembling such an isolator, in addition to those already discussed. These are easily within the skill of circuit design and semiconductor engineers. For example, the MR elements must be placed relative to the magnetic field provided by the coils so as, preferably, to have the magnetic field direction coincide substantially with the sensors' lengthwise, most-sensitive, direction. The MR elements will thus generate the greatest output for a given magnetic field if they (the MR elements) are all similarly oriented relative to the magnetic field.

Figure 8:
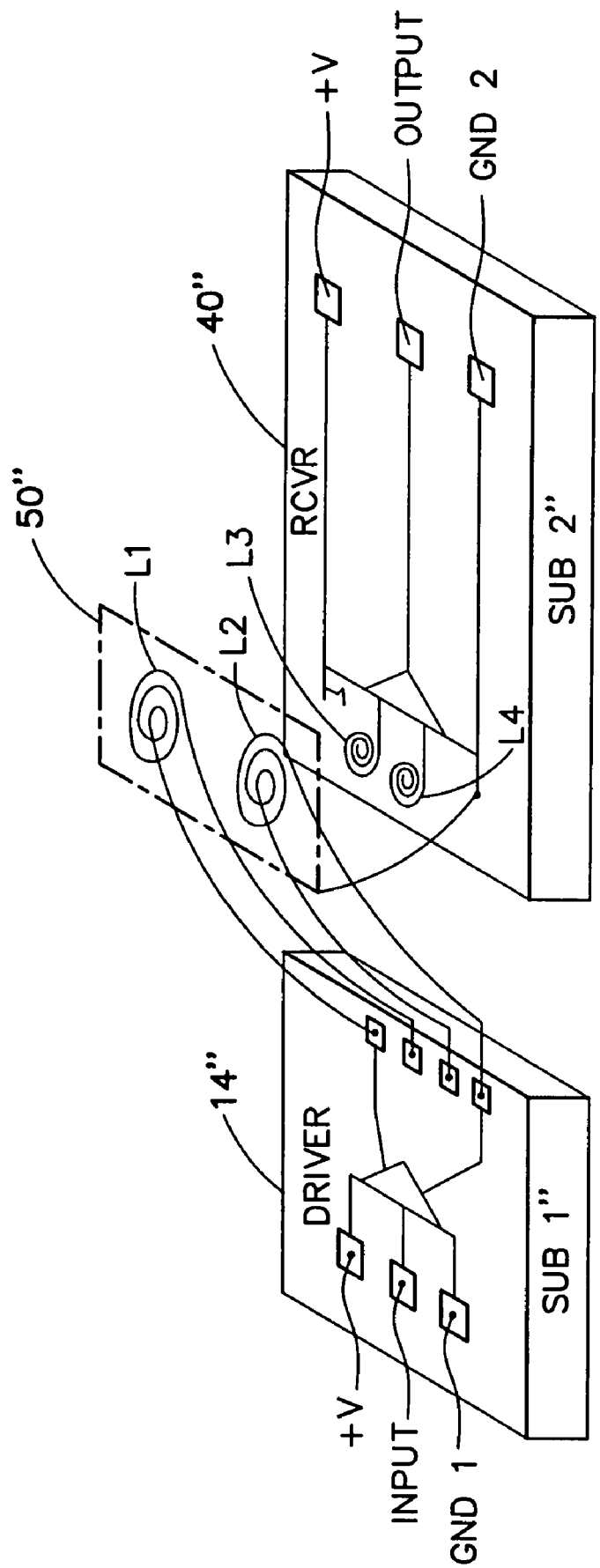

FIG. 8 shows an isolator that is similar in certain fabrication aspects to the isolator shown in FIG. 5, except that in FIG. 8, the GMR receiving elements have been replaced by a second set of (output or secondary) coils (140 and 142), to provide magnetic (i.e., inductive) coupling from input coils L1, L2 to output coils 140, 142; that is, to form two transformers. The top (input, or primary) coils can be separated from the respective bottom (output, or secondary) coils with dielectric layers of appropriate composition and thickness, and by a Faraday shield 50".

The driver and receiver circuitry which is used should be selected with the application for the isolator and with the characteristics of the selected passive components (e.g., coils, GMR elements, etc.) in mind.

Figure 9:
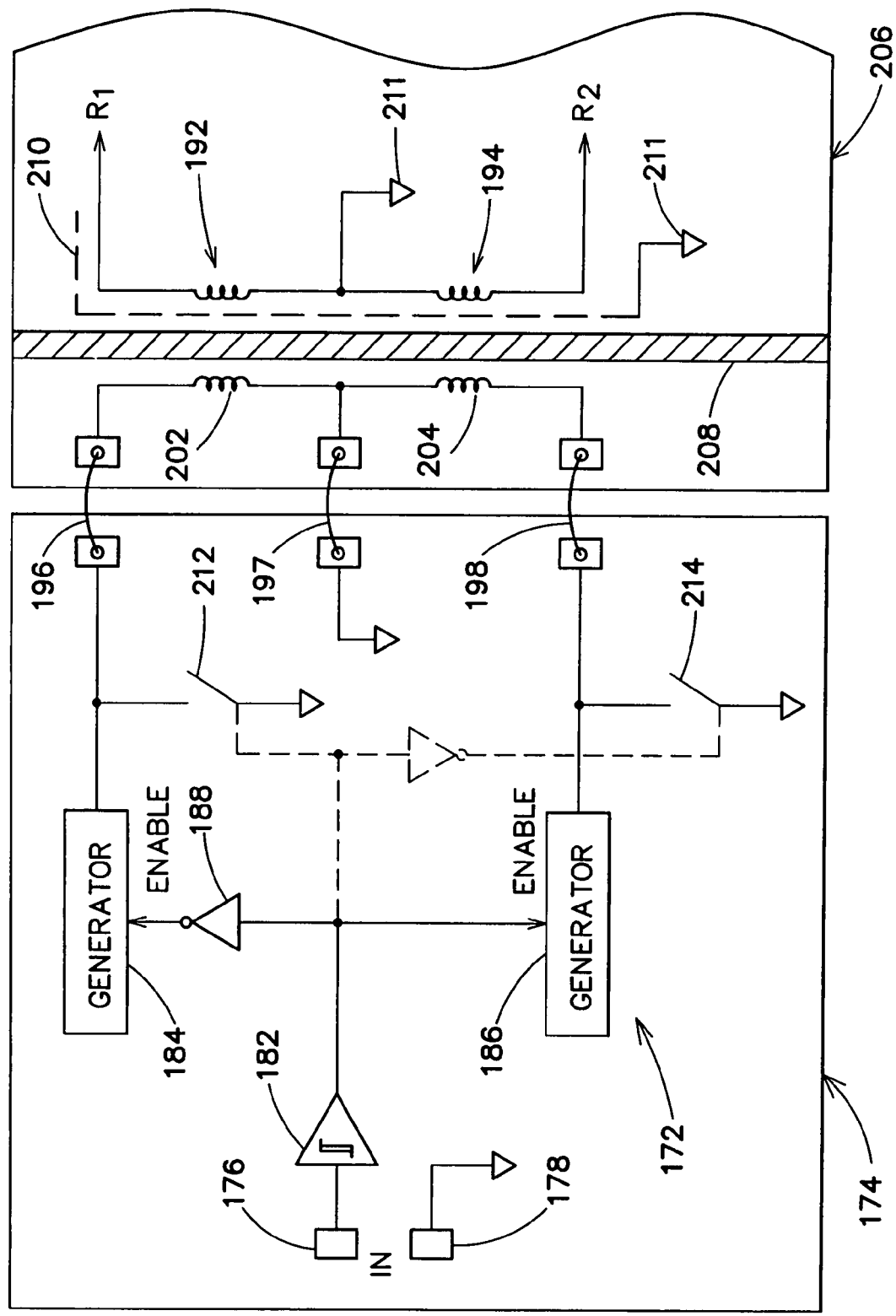
FIGS. 9 and 10 are combination block/schematic/diagrammatic illustrations showing an alternative implementation for a coil-coil version of an isolator according to said application.
Figure 10:
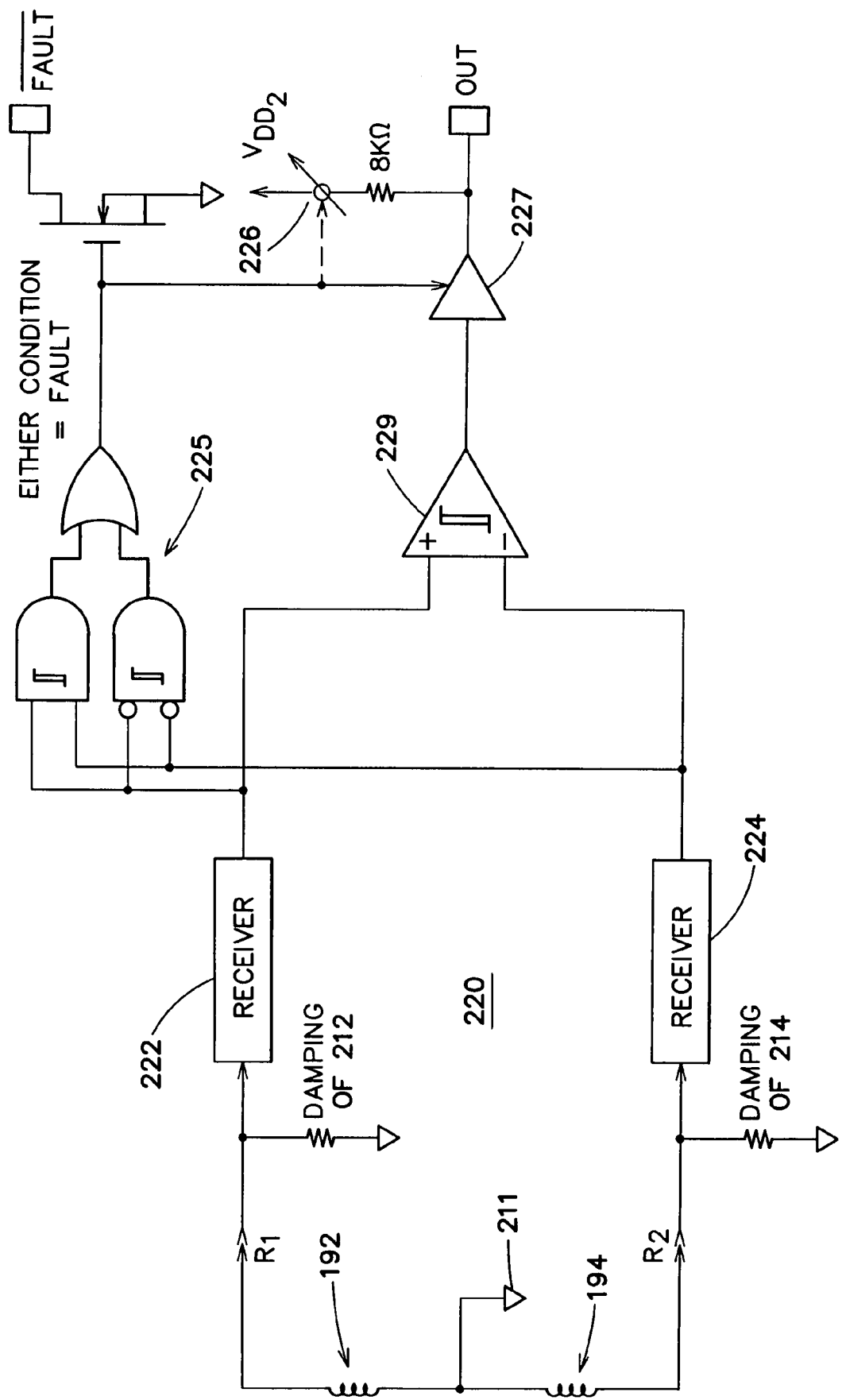

Referring to FIGS. 9 and 10, there is shown a block diagram/diagrammatic illustration for an exemplary coil-coil isolator. A driver circuit 172 on a first substrate 174 receives a logic signal input on pad 176 (referenced to an input ground pad 178). In the driver circuit, the input signal drives a Schmidt trigger 182 which, in turn, drives the enable inputs of a first pulse generator 184 and a second pulse generator 186, the former via an inverter 188. Information is coupled from the input side of the isolation barrier to the output side of the isolation barrier in the form of SET and RESET pulses to a differential receiver with hysteresis (not shown) connected to receive the outputs of coil windings 192, 194, which form the secondary windings of a transformer. The pulse generators 184, 186 drive (via wires 196-198) coils 202, 204, respectively, which form the primary windings of two transformers. Coils 202, 204, 192, 194 are formed on (which could include in) a second substrate 206 (which is electrically isolated from the first substrate). Between coils 202, 204 on one hand and coils 192, 194 on the other hand is formed an isolation layer 208 of a dielectric material. Preferably, a Faraday shield 210 also is formed between the primary and secondary windings, with the Faraday shield being connected to a ground 211 which is galvanically isolated from the input ground 178 and which is the reference ground for the output circuits (not shown) driven by coils 192, 194. As shown in FIG. 8, the Faraday shield may be formed over windings 192, 194; the isolation layer 208 (not shown) is formed over the coils 192, 194; and the coils 202, 204 are formed over the isolation layer.

Switches 212 and 214 effectively short out their respective windings when not transmitting data. An external electromagnetic field would try to couple inductively into the secondary windings but the primary windings appear shorted and thus prevent voltage from being induced in the respective secondary windings. This provides immunity to electromagnetic interference.

The pulse generators create pulses in response to the rising edge or failing edge of the input signal. On the driver side, a watchdog circuit (not shown) preferably monitors the edge activity of the input. If no edges are received for more than one or two microseconds, then a pulse is sent anyway, representing the logical level of the input. The circuitry may be designed such that those pulses do not collide with edge-generated pulses and so that edge-generated pulses take precedence.

An exemplary receiver circuit 220 is shown in FIG. 10. The receiver includes circuits 222 and 224 that monitor the pulses received from the transformers' secondaries. If pulses are not received from either one for more than four or five microseconds, then through logic 225 the FAULT output is pulled low, the output driver 227 (which buffers a differential comparator 229) goes in to a tri-state (high impedance) condition, and the output is pulled high resistively via a switch 226. If pulses are received simultaneously from both secondary windings, the assumption is that they are due to common mode noise pickup and they may be ignored.

To reduce the size of the coils needed, instead of a single pulse there may be transmitted a burst of several (e.g., three to five) cycles of a high frequency (e.g., 1.1 GHz) carrier. In this case, the receiver circuits 222 and 224 may rectify the bursts and present that information to a differential comparator. As another alternative, a continuous carrier may be transmitted via one of the transformers.

Figure 11:
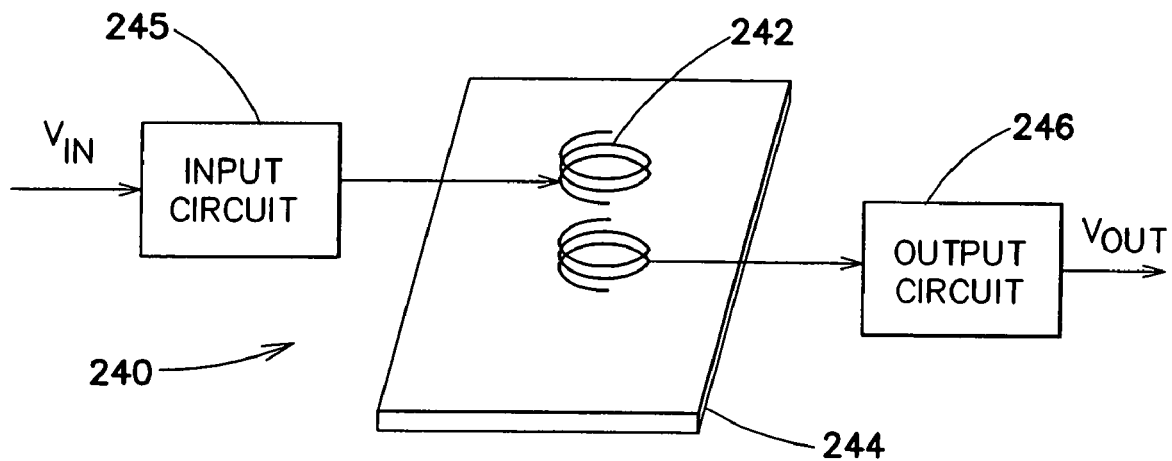
FIG. 11 is a diagrammatic illustration of a transformer-based (also called "coil-coil") isolator as taught herein, wherein a single transformer establishes the isolation barrier and the transformer is of a planar type having windings formed on or in a substrate including neither input nor output circuitry.

FIG. 11 shows a first exemplary embodiment of a resulting isolator 240 in which isolation is provided by a single transformer 242 formed on or in a substrate 244 and wherein an appropriate input circuit 245 and output circuit 246 are not formed on substrate 244. The input circuit 245 formats the input signal Vin into a format suitable for driving the primary winding of transformer 242, while the output circuit 246 formats the output from the transformer secondary winding into an output signal Vout. Optionally, devices (not shown) additional to transformer 242 may be formed on substrate 244, though it is preferable that these devices not be part of the input or output circuitry. Each of the input and output circuits may be formed on their own respective substrates such as the substrates 252 and 254 illustrated, respectively, in FIGS. 14-17.

Figure 12:
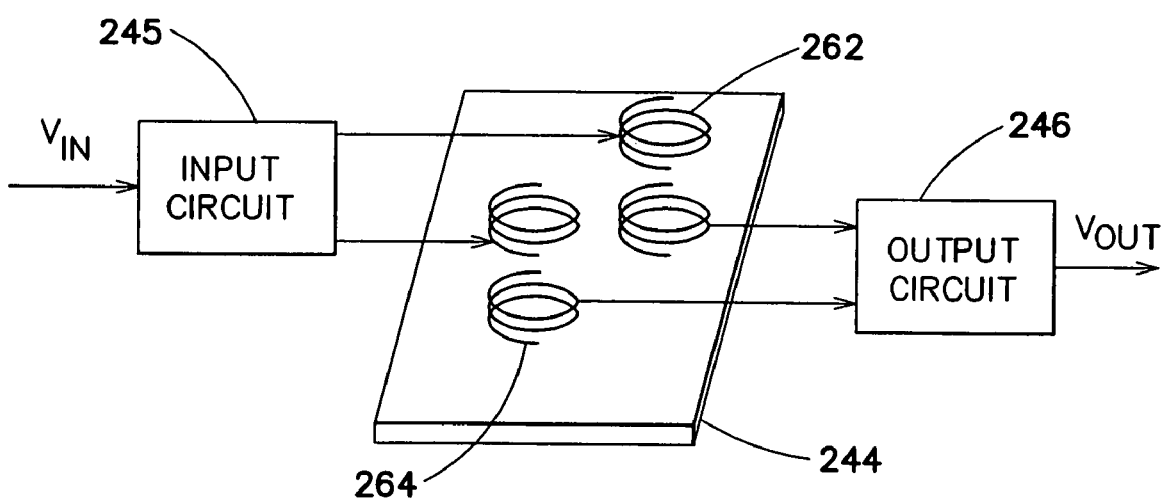
FIG. 12 is a diagrammatic illustration of another transformer-based isolator as taught herein, wherein a pair of transformers establish the isolation barrier and the transformers are of planar type having windings formed on or in a substrate including neither input nor output circuitry.

Isolation between the input circuit and output circuit may be provided by a single transformer 242 as in FIG. 11 or via multiple transformers such as the pair of transformers 202, 192 and 204, 194 of FIG. 9 or 262, 264 shown in FIG. 12. In the case of an isolator according to FIG. 12, the input and output circuits may, for example, be as illustrated in FIGS. 9 and 10, or as otherwise desired as a matter of design choice. FIGS. 11 and 12 may accept and provide either analog or digital signals, depending upon the specifics of the input and output circuits that are employed.

Figure 13:
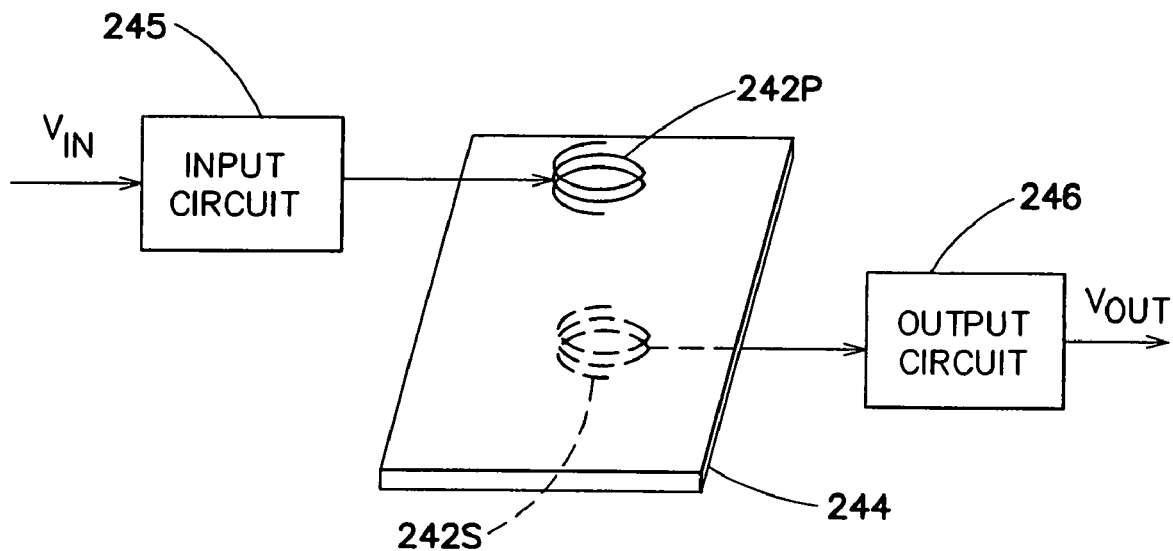
FIG. 13 is a diagrammatic illustration of another transformer-isolator similar to that of FIG. 11 except that the primary and secondary windings of the transformer are disposed on opposite surfaces of the substrate.

Turning to FIG. 13, there is shown a variation on the single coil isolator of FIG. 11, wherein the primary coil winding 242P is formed on a first side of substrate 244 and a secondary coil winding 242S is formed on another (e.g., bottom) surface of the substrate. Note that the substrate for the isolation coil windings need not be a semiconductor substrate. The substrate itself and insulation material between the coil windings (not shown in some Figs.) may be formed from a variety of suitable materials including, but not limited to, polyamides, benzocyclobutenes, Hardbake, DNQ-Novolac photoresist, and SU-8 photoresists. Exemplary materials for the transformer coils include, among others, gold, copper, aluminum, silver and alloys which include at least one of the foregoing elements. Coil windings may be formed in a variety of ways, such as by using deposition techniques or etching processes. Typically, coils driven by single pulses may occupy from about 70,000 to about 100,000 square microns while coils driven by bursts may occupy only about 30,000 to 50,000 square microns under similar conditions. The spacing separating the coils may be held to less than about 200 microns with the above-listed or comparable insulation materials and withstand a potential of up to about 10,000 volts between the primary and secondary windings.

Use of a non-semiconductor substrate avoids a variety of complications that arise from using a semiconductor substrate for the coils. Among the complications, a large potential of a first polarity on a coil may cause a current between the coil and the substrate, while a potential of opposite polarity may cause a large capacitance between the coil and substrate.

Figure 14:
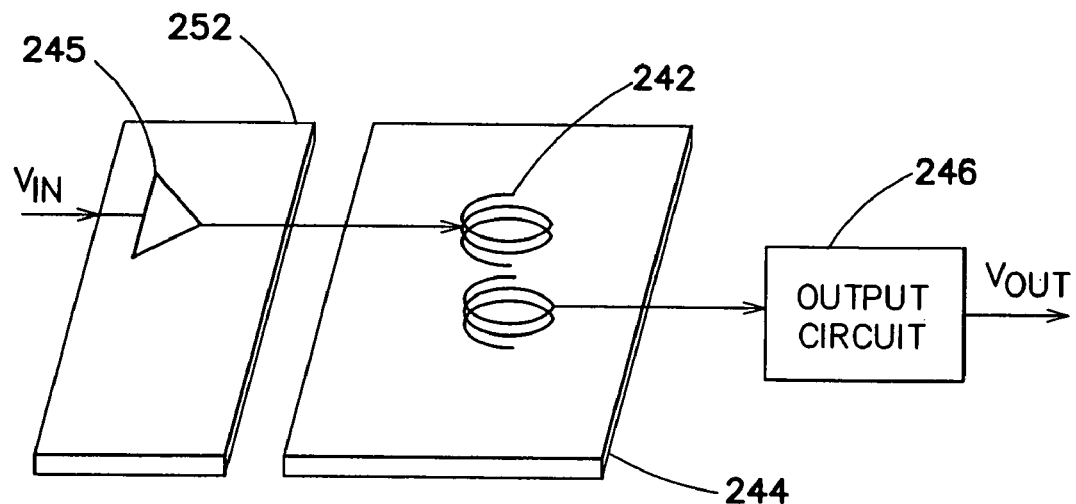
FIG. 14 is a diagrammatic illustration of yet another transformer-based isolator, similar to that of FIG. 11, wherein the input circuitry is formed on its own substrate which is separate from the substrate carrying the transformer.

In FIGS. 11-13, the input and output circuits are shown but not any specific packaging of them. FIG. 14 illustrates an implementation of the isolator of FIG. 11 wherein the input circuit is embodied in a second substrate 254, which is typically a semiconductor substrate and the packaging of the output circuit is still unspecified.

Figure 15:
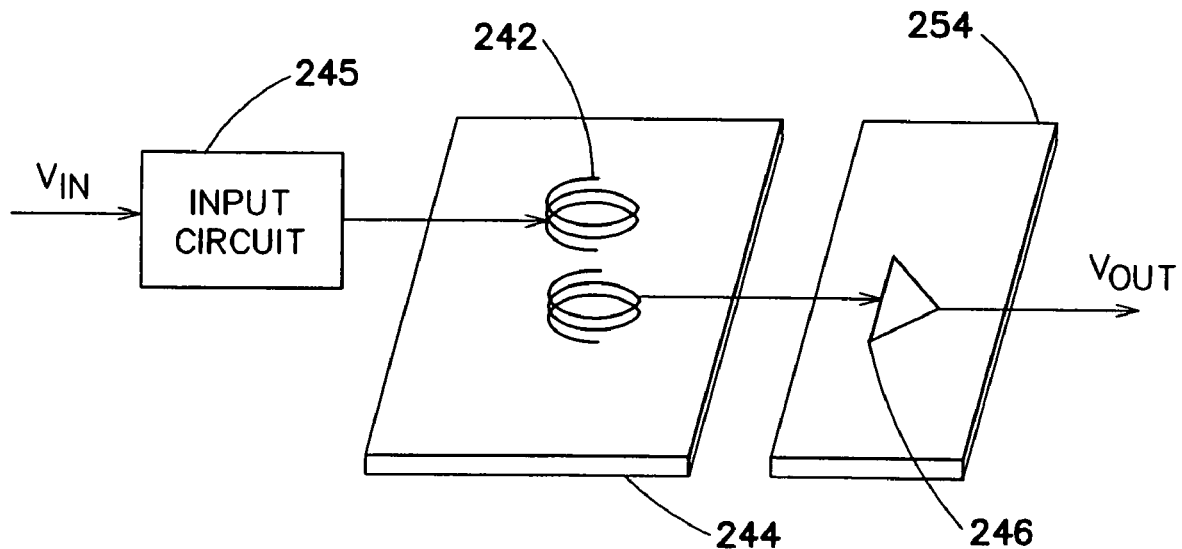
FIG. 15 is a diagrammatic illustration of yet another transformer-based isolator, similar to that of FIG. 11, wherein the output circuitry is formed on its own substrate which is separate from the substrate carrying the transformer.

FIG. 15 correspondingly depicts and implementation of the isolator of FIG. 11 wherein the output circuit is embodied on a separate substrate 254, which also typically would be a semiconductor substrate.

Figure 16:
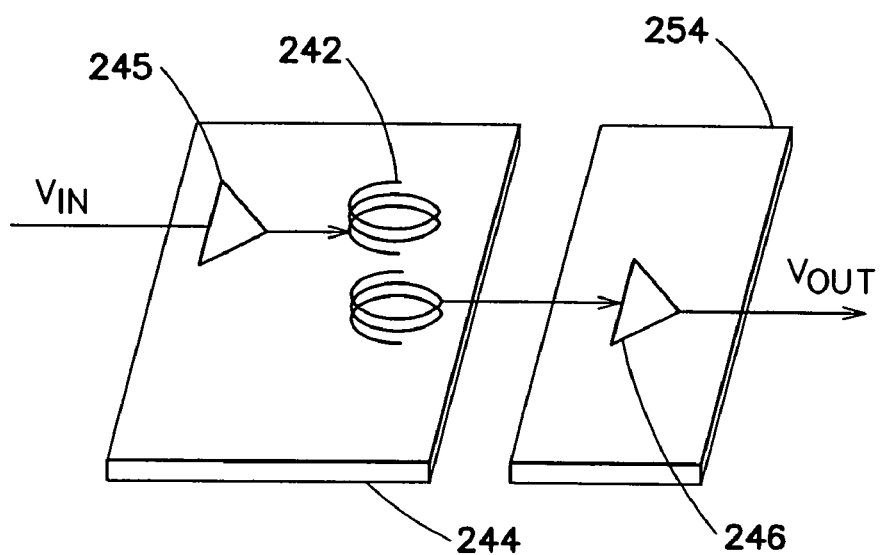
FIG. 16 is a diagrammatic illustration of still another transformer-based isolator wherein the input circuitry and the transformer are formed on the same substrate, but the output circuitry is formed on a separate substrate.

Alternatively, as shown in FIG. 16, the input circuitry or a portion thereof may be formed within the same substrate 244 as the transformer 242. Of course, this probably is not as cost-effective as the implementations wherein the coils are on their own substrate.

Figure 17:
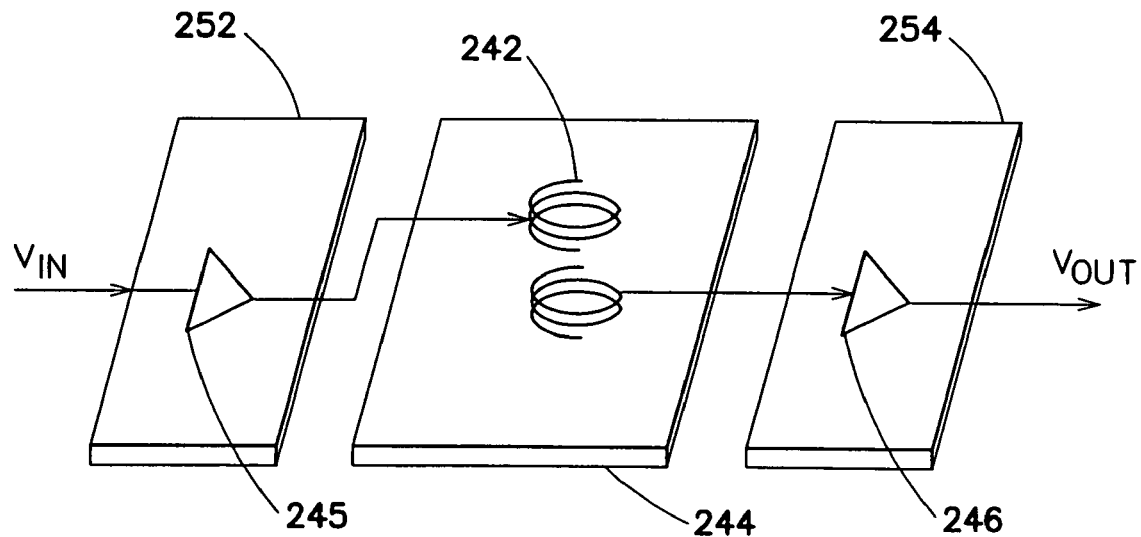
FIG. 17 is a diagrammatic illustration of yet another transformer-based isolator, wherein each of the input circuitry and the output circuitry is formed on its own substrate and, in turn, each of those substrates is separate from the substrate carrying the transformer.
Figure 18:
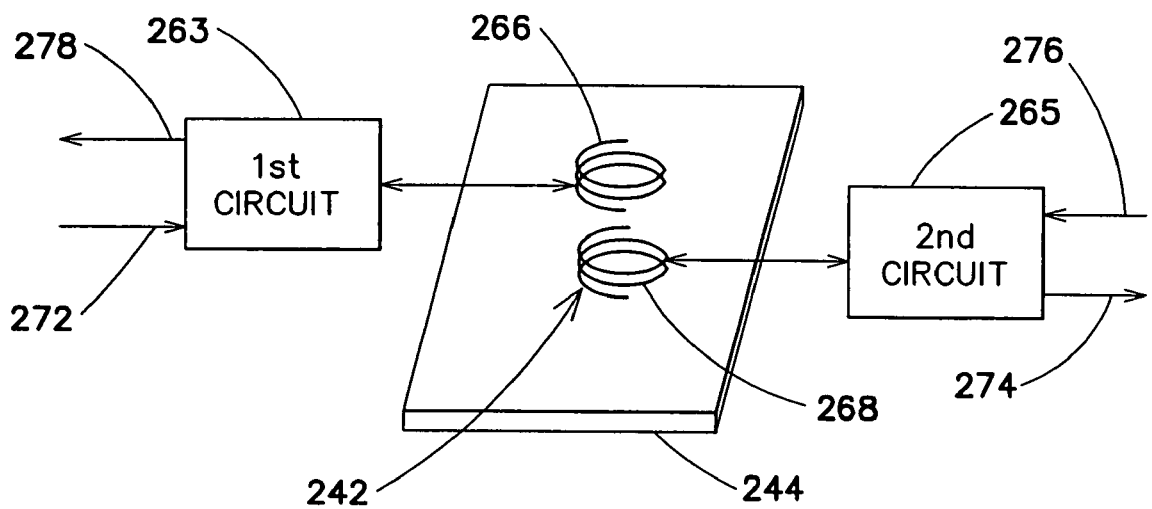
FIG. 18 is a diagrammatic illustration of a hi-directional transformer-based isolator, wherein the transformer is formed on its own substrate.

In other variations, both the input circuit and the output circuit could be on separate and independent substrates 252 and 254 as shown in FIG. 17. The same approaches may be used to fabricate/assemble bi-directional and multi-channel isolators. A block diagram for a bi-directional isolator as taught herein appears in FIG. 18. As shown there, a first circuit 262 is connected through a bi-directional lead or link to a first coil 266 on a substrate 244 and a second coil 268 which is inductively coupled to the first coil is operably connected bi-directionally to a second circuit 264. Each of the first circuit and second circuit may perform the functions of both input circuit and output circuit. That is, the first circuit may format a first input signal from line 272 into a format suitable for, and delivered to, the first winding 266 of the transformer (formed by coils 266 and 268), generating a corresponding signal in the second winding 268 which is coupled to the second circuit 264 that, in turn, provides a corresponding output on line 274. Alternatively, the input signal may be supplied to second circuit 264 on line 276 and an output is supplied by first circuit 262 on line 278. The input and output signals may be analog or digital, upon selection of suitable input and output circuits.

In bi-directional use of an isolation transformer having stacked windings, in one direction the top coil is the input (or primary) winding and the bottom coil is the output (or secondary) winding, while in the other direction the roles of the coils are reversed. That is, in the first situation the signal is driven from top to bottom and in the other situation the signal is driven from bottom to top. That is problematic when the bottom coil is closer to the substrate than the top coil, as that configuration makes it more difficult to transmit the field from the bottom coil than from the top coil. With a silicon substrate, substrate conductivity causes the capacitance to ground of the bottom coil to be much higher than that for the top coil. This increased capacitance causes multiple problems for the drive function. For example, it can cause oscillations and lead to an increase in power consumption, pulse width distortion and a degradation in the maximum data rate for which the isolator is usable. Addressing this capacitance problem calls for reducing the capacitance by modifying the substrate, the coil configurations, or both. For example, the silicon substrate (having a resistivity typically of about 10 ohm-cm) may be replaced with a substrate of higher resistivity, such is a glass. Such a substrate acts more like an insulator and reduces the capacitance between each winding and ground. The capacitance between the bottom coil and the substrate also can be decreased by using a thicker dielectric (or one of lower dielectric constant) between the substrate and the bottom coil.

The ability to transmit from bottom coil to top coil as well as from top coil to bottom coil lowers unit cost for isolators by permitting a single transformer to provide a duplex path, and may reduce development time, also. Additionally, for isolators providing bi-directional communication, the ability to transmit from both bottom coil to top coil and vice versa is required for a three-chip arrangement having coils on a stand-alone substrate unless the size is not a consideration. This is a result of the fact that if the input signals from both directions both have to be fed to the top coils, there will not be effective isolation between them. Using one or both of a higher (than silicon) resistivity substrate and a thick dielectric between the substrate and the bottom coil alleviates some performance difficulties and simplifies duplex (i.e., bi-directional) use.

Using current processing technologies and their costs, we have estimated, for comparison purposes, cost data for typical two- and three-chip implementations of a two-channel coil-coil isolator with bi-directional communication. These cost estimates, while excluding yield implications and based on fictitious cost data, nevertheless serve to illustrate the benefits of the concepts introduced here. Assembly cost for a two-chip configuration with only top-to-bottom transmission through the transformers was computed at about $0.37. Assembly cost for a two-chip configuration with bi-directional communication (top-to-bottom and bottom-to-top) through the transformers) reduced the computed cost to $0.31. With a three-chip configuration employing bi-directional communication, the computed cost fell to $0.27. Table 1, below, provides greater detail about the calculations.

TABLE 1

| Assumptions (Two Channels in Opposing Directions) | |
|---|---|
| Semiconductor Wafer Cost | $ 1,000 |
| Post-Processing Water Cost | $ 1,000 |

| | Contents | Die/Wafer | $/Die |
|---|---|---|---|
| Embodiment A 2-Chip Approach with only top-to-bottom communication | | | |
| Chip #1 | 1 Driver + 1 Receiver + 2 transformers | 16,000 | $ 0.13 |
| Chip #2 | 1 Driver + 1 Receiver + 2 transformers | 16,000 | $ 0.13 |
| Chip #3 Packaging Cost | | | $ 0.12 |
| Total Assembly Cost | | | $ 0.37 |
| Embodiment B 2-Chip Approach with top-to-bottom and bottom-to-top communication | | | |
| Chip #1 | 1 Driver + 1 Receiver | 50,000 | $ 0.02 |
| Chip #2 | 1 Driver + 1 Receiver + 4 transformers | 12,000 | $ 0.17 |
| Chip #3 Packaging Cost | | | $ 0.12 |
| Total Assembly Cost | | | $ 0.31 |
| Embodiment C 3-Chip Approach | | | |

TABLE 1-continued

| Chip #1 | 1 Driver + 1 Receiver | 50,000 | $ 0.02 |
|---|---|---|---|
| Chip #2 | 4 transformers | 13,000 | $ 0.08 |
| Chip #3 | 1 Driver + 1 Receiver | 50,000 | $ 0.02 |
| Packaging Cost | | | $ 0.15 |
| Total Assembly Cost | | | $ 0.27 |

Figure 19:
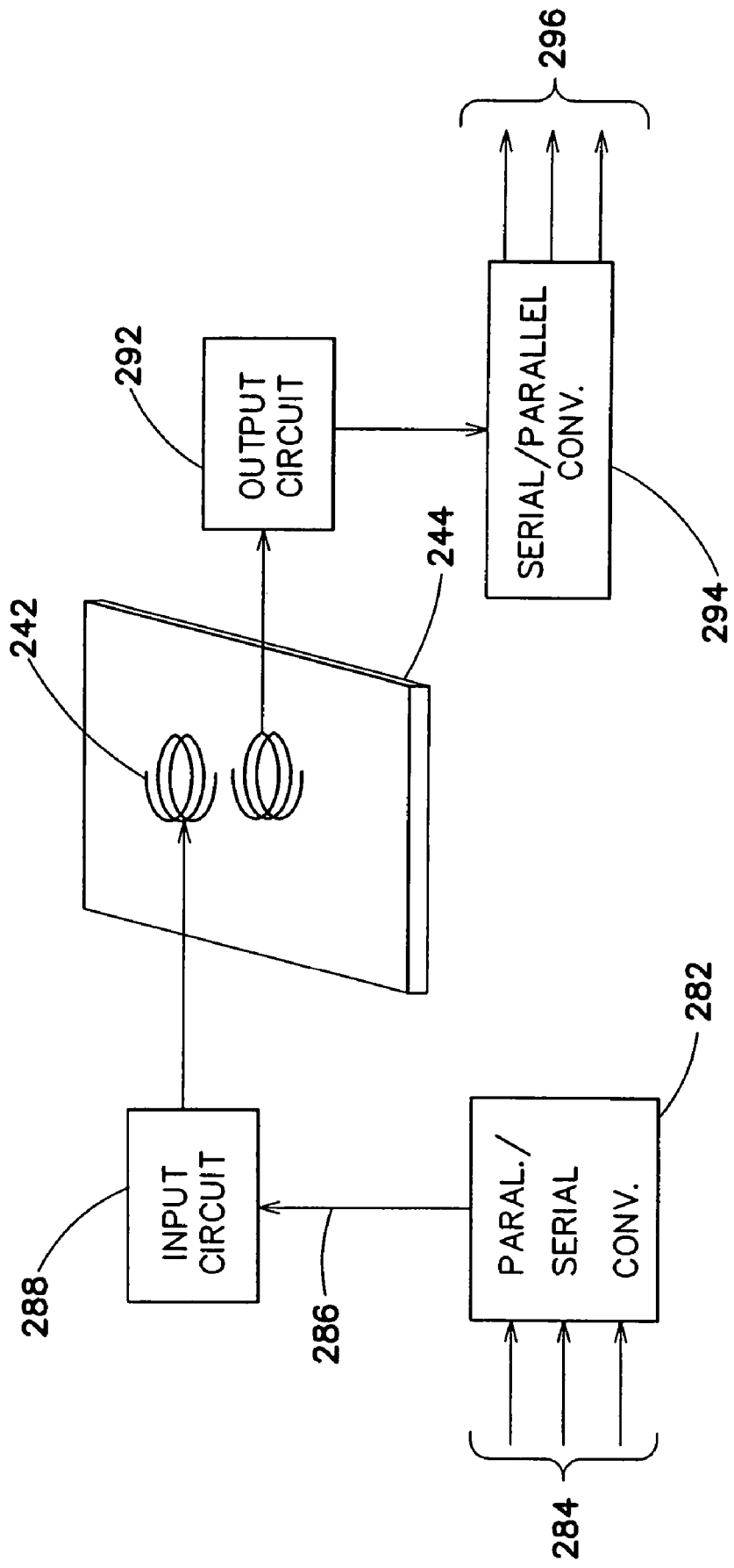
FIG. 19 is a diagrammatic illustration of a multi-channel transformer-based isolator as taught herein, with the transformer formed on its own substrate.

The isolators of FIGS. 11-18 may be used in appropriate combinations, in addition to singly. When packaged in combination, they can form multi-channel isolators. The transformers for individual isolators may be formed on a common substrate and input and output circuitry may correspondingly be formed on and share one or two other substrates. Or in a variation, indeed, input circuitry for one isolator may be formed on the same substrate as output circuitry for another isolator. As well, bi-directional input/output circuitry may be formed on the same substrate as input or output circuitry of another isolator or on the substrate on which the coil windings are formed. Another use of the current teachings is to form a multi-channel isolator in which a single isolation transformer may be used to process signals for multiple channels for still greater cost efficiencies. FIG. 19 shows just one possible implementation of such a multi-channel isolator. In addition to the components shown in FIG. 11, a parallel-to-serial converter 282 is coupled between multiple input signal lines 284 and a single input line 286 to input circuit 288. The output circuit 292 supplies an output signal to a corresponding serial-to-parallel converter 294 which supply outputs on several lines 296.

The various designs and configurations discussed herein, and their variations, lend themselves to chip-scale products. That is, to packaging in integrated circuit-size packages. This is a direct result of the coil-on-substrate architecture. Low cost, small size and very good performance characteristics are achieved.

As used herein, unless context requires otherwise, such as in the preceding paragraph and claims, when a coil is said to be formed "on" a substrate, "on" should be understood to include "in" or partially in the substrate.

Having thus described the invention and various illustrative embodiments of the invention, some of its advantages and optional features, it will be apparent that such embodiments are presented by way of example only and not by way of limitation. Those persons skilled in the art will readily devise alterations and improvements on these embodiments, as well as additional embodiments, without departing from the spirit and scope of the invention. For example, it will be appreciated that although the MR sensor is shown as a bridge circuit in the illustrated embodiments, a single MR element or two MR elements might be employed, instead, and four elements might be arranged in a manner other than as a bridge. Likewise, though two coils are shown as the magnetic field generation members, one might choose to use just one coil, or some other number than two, with appropriate driver circuitry. The driver circuit is not needed in all cases, as the input signal source may be able to drive the coils directly. Alternatively, some other magnetic-field generating apparatus may be employed. Though several embodiments are shown in which the field-receiving elements are coils, it deserves repeating that they could also be MR or GMR elements. Also, the roles of the coils in the all-coil embodiments may be reversed, with the "lower" coils being driven by the input driver circuits and the "upper" coils being the receiving coils on the output side of the isolation barrier and supplying the output signals. It is impossible to enumerate all of the variations that will quite quickly occur to those in the art. Accordingly, the invention is limited only as defined in the following claims and equivalents thereto.

What is claimed is:

1. A signal isolator comprising:
   a first substrate;
   a first transformer formed on the first substrate including a first bottom winding and a second top winding;
   an input circuit operatively connected to drive the second winding of the transformer in response to a received input signal;
   an output circuit operatively connected to receive a signal from the first winding responsive to the drive from said input circuit and to generate an output signal responsive to said signal received from the first winding;
   a second input circuit operatively connected to drive the first winding; and
   a second output circuit operatively connected to receive a signal from the second winding responsive to the drive from the second input circuit,
   wherein at least one of the input circuits and one of the output circuits are not formed on the first substrate.

2. The signal isolator of claim 1 wherein the first winding is disposed on the first substrate and the second winding is disposed above the first winding and electrically insulated from the first winding.

3. The signal isolator of claim 1 wherein at least one of the input circuit and the output circuit is formed in or on a semiconductor substrate which is not the first substrate.

4. The signal isolator of claim 3 wherein the input circuit is formed in or on a first semiconductor substrate and the output circuit is formed in or on a second semiconductor substrate.

5. The signal isolator of claim 4 wherein either the first semiconductor substrate or the second semiconductor substrate is the same as the first substrate.

6. The signal isolator of any of claims 1, 3 or 4 wherein there are formed on or in the first substrate one or more elements other than the first transformer, which elements are not part of the input circuit or output circuit.

7. The signal isolator of claim 1 wherein the transformer comprises a first winding disposed on or in a first surface of the first substrate and a second winding disposed on or in an opposing second surface of the first substrate.

8. The signal isolator of any of claims 1, 2, 4, 5 and 7 further including a Faraday shield disposed between the windings of the transformer.

9. The signal isolator of any of claims 1, 2, 4, 5 and 7 wherein the first substrate is formed of a material having a resistivity substantially higher than 10 ohm-cm.

10. The isolator of any of claims 1-5 further including an insulation material disposed between windings of the transformer.

11. The isolator of claim 10, further comprising a layer of dielectric material is disposed on a surface of the first substrate between the substrate and the bottom winding of the transformer.

12. The isolator of claim 11 wherein said input circuit is operatively connected to drive the first winding and said output circuit is operatively connected to receive a signal from the second winding responsive to the drive from said input circuit.

13. A multi-channel isolator in which two or more channels are provided for communicating in opposing directions, comprising:
   a first semiconductor substrate containing input circuitry for channels of first directionality and output circuitry for channels of second, opposing directionality;

a second semiconductor substrate containing output circuitry for channels of first directionality and input circuitry for channels of second directionality; and a third substrate containing one or more transformers each with first windings in or on the third substrate and with second windings disposed above the first windings and with interconnections from the first substrate circuitry to the first windings and from the second substrate circuitry to the second windings.

14. A signal isolator comprising:
a first substrate;
a coil formed in or on the first substrate for use in generating a magnetic field; a magnetic field-receiving element formed under or over the coil and spaced therefrom by an insulator;
an input circuit operatively connected to drive the coil in response to a received input signal;
an output circuit operatively connected to generate an output signal responsive to a signal from the field-receiving element; and
wherein neither the input circuit nor the output circuit is formed on the first substrate.

15. The signal isolator of claim 14 wherein the field-receiving element includes at least one MR element.

16. A method of providing signal isolation comprising:
providing a first substrate;
forming a first transformer on the first substrate the transformer including a first, bottom winding and a second, top winding an;
operatively connecting to the first winding of the transformer a first input circuit to drive the transformer in response to a received input signal; and
operatively connecting a first output circuit to the second winding of the transformer to generate an output signal responsive to a signal from the transformer;
operatively connecting to the second winding of the transformer a second input circuit to drive the transformer in response to a received input signal; and
operatively connecting a second output circuit to the first winding of the transformer to generate an output signal responsive to a signal from the transformer,
without forming at least one of the input circuits and the output circuits on the first substrate.

17. The method of claim 16 wherein the act of forming the transformer includes forming the transformer with the first winding disposed on the first substrate and the second winding disposed above the first winding and electrically insulated from the first winding.

18. The method of claim 16 further including:
forming at least one of the input circuit and the output circuit in or on a semiconductor substrate which is not the first substrate.

19. The method of claim 18 wherein the input circuit is formed in or on a first semiconductor substrate and the output circuit is formed in or on a second semiconductor substrate.

20. The method of claim 19 wherein either the first semiconductor substrate or the second semiconductor substrate is the same as the first substrate.

21. The method of any of claims 16, 18 or 19 further including forming on or in the first substrate one or more elements other than the first transformer, which elements are not part of the input circuit or output circuit.

22. The method of claim 16 wherein forming the transformer includes forming the first winding disposed on or in a first surface of the first substrate and the second winding disposed on or in an opposing second surface of the first substrate.

23. The method of any of claims 16, 17, 19, 20 and 22 further including providing a Faraday shield disposed between the windings of the transformer.

24. The method of any of claims 16, 17, 19, 20 and 22 further including forming the first substrate of a material having a resistivity substantially higher than 10 ohm-cm.

25. The method of any of claims 16-20 further including disposing an insulation material between windings of the transformer.

26. The method of claim 25 wherein said method further includes disposing a layer of dielectric material on a surface of the first substrate between the substrate and the bottom winding of the transformer.

27. The method of claim 26 further including operatively connecting said input circuit to drive the first winding and said output circuit to receive a signal from the second winding responsive to the drive from said input circuit.

28. A method for forming a multi-channel isolator in which two or more channels are provided for communicating in opposing directions, comprising:
forming on a first semiconductor substrate input circuitry for channels of first directionality and output circuitry for channels of second, opposing directionality;
forming on a second semiconductor substrate output circuitry for channels of first directionality and input circuitry for channels of second directionality;
forming on a third substrate one or more transformers each with a first winding in or on the third substrate and with a second winding disposed above said transformer's first winding; and
interconnecting the first substrate circuitry to the first windings and the second substrate circuitry to the second windings.

29. A method for forming a signal isolator comprising:
providing a first substrate;
forming a coil in or on the first substrate for use in generating a magnetic field;
forming a magnetic field-receiving element under or over the coil and spaced therefrom by an insulator;
operatively connecting an input circuit to drive the coil in response to a received input signal; and
operatively connecting an output circuit to generate an output signal responsive to a signal from the field-receiving element;
wherein neither the input circuit nor the output circuit is formed on the first substrate.

30. The method of claim 29 wherein the field-receiving element includes at least one MR element.

31. A signal isolator comprising:
a first substrate;
a single transformer formed on the first substrate including first, bottom winding and a second, top winding and;
an input circuit operatively connected to drive the second winding of the transformer in response to a received input signal;
an output circuit operatively connected to generate an output signal responsive to a signal from first winding of the transformer;
a second input circuit operatively connected to drive the first winding; and
a second output circuit operatively connected to receive a signal from the second winding responsive to the drive from the second input circuit,
wherein at least one of the input circuits and the output circuits is not formed on the first substrate.

32. The signal isolator of claim 31 wherein the transformer includes a first winding disposed in or on the first substrate and a second winding disposed above the first winding and electrically insulated from the first winding.

33. The signal isolator of claim 31 wherein at least one of the input circuit and the output circuit is formed in or on a semiconductor substrate which is not the first substrate.

34. The signal isolator of claim 33 wherein the input circuit is formed in or on a first semiconductor substrate and the output circuit is formed in or on a second semiconductor substrate.

35. The signal isolator of claim 31 wherein either the first semiconductor substrate or the second semiconductor substrate is the same as the first substrate.

36. The signal isolator of claim 31 wherein the transformer comprises a first winding disposed on or in a first surface of the first substrate and a second winding disposed on or in an opposing second surface of the first substrate.

37. The signal isolator of any of claims 31-36 wherein the first substrate is formed of a material having a resistivity substantially higher than 10 ohm-cm.

38. The isolator of any of claims 31-36 further including an insulation material disposed between windings of the transformer.

39. The signal isolator of claim 38 wherein the first substrate is formed of a material having a resistivity substantially higher than 10 ohm-cm.

40. The isolator of any of claims 31-36 further comprising a layer of dielectric material is disposed on a surface of the first substrate between the substrate and the bottom winding of the transformer.

41. The isolator of claim 40 wherein said input circuit is operatively connected to drive the second winding and said output circuit is operatively connected to receive a signal from the first winding responsive to the drive from said input circuit.

42. The isolator of claim 40 wherein said input circuit is operatively connected to drive the first winding and said output circuit is operatively connected to receive a signal from the second winding responsive to the drive from said input circuit.

43. A signal isolator comprising:
a substrate;
a transformer including a bottom winding provided on the substrate and a top winding provided over the bottom winding;
a first circuit connected to the top winding of the transformer to receive a signal from the top winding responsive to a drive signal applied to the bottom winding; and
a second circuit connected to the bottom winding of the transformer to receive a signal from the bottom winding responsive to a drive signal applied to the top winding,
wherein at least one of the first and second circuits is formed separate from the first substrate.

44. A multi-channel isolator in which two or more channels are provided for communicating in opposing directions, comprising:
a first semiconductor substrate containing input circuitry for a channel of first directionality and output circuitry for channels of second, opposing directionality;
a second semiconductor substrate containing output circuitry for a channel of first directionality and input circuitry for channels of second directionality; and
a transformer including first windings on one of the first and second semiconductor substrates and second windings disposed above the first windings and further including interconnections from the first substrate circuitry to the first windings and from the second substrate circuitry to the second windings.

* * * * *